US008645780B2

(12) United States Patent
Wohl et al.

(10) Patent No.: US 8,645,780 B2
(45) Date of Patent: Feb. 4, 2014

(54) FULLY X-TOLERANT, VERY HIGH SCAN COMPRESSION SCAN TEST SYSTEMS AND TECHNIQUES

(71) Applicant: Synopsys, Inc., Mountain View, CA (US)

(72) Inventors: Peter Wohl, Williston, VT (US); John A. Waicukauski, Tualatin, OR (US); Frederic J. Neuveux, Meylan (FR)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/910,888

(22) Filed: Jun. 5, 2013

(65) Prior Publication Data
US 2013/0268817 A1  Oct. 10, 2013

Related U.S. Application Data

(62) Division of application No. 13/172,752, filed on Jun. 29, 2011, now Pat. No. 8,464,115, and a division of application No. 12/363,520, filed on Jan. 30, 2009, now Pat. No. 7,979,763.

(60) Provisional application No. 61/107,239, filed on Oct. 21, 2008.

(51) Int. Cl.
*G01R 31/28* (2006.01)

(52) U.S. Cl.
USPC ............................................ 714/732; 714/729

(58) Field of Classification Search
USPC ............................................ 714/728, 729, 732
See application file for complete search history.

(56) References Cited

U.S. PATENT DOCUMENTS

| | | | |
|---|---|---|---|
| 6,684,358 B1 | 1/2004 | Rajski et al. | |
| 6,807,646 B1 | 10/2004 | Williams et al. | |
| 7,032,148 B2 | 4/2006 | Wang et al. | |
| 7,178,078 B2 | 2/2007 | Hiraide et al. | |
| 7,395,473 B2 | 7/2008 | Cheng et al. | |
| 7,610,527 B2 | 10/2009 | Wang et al. | |
| 7,716,548 B2 | 5/2010 | Cheng et al. | |

(Continued)

FOREIGN PATENT DOCUMENTS

| | | |
|---|---|---|
| JP | 2002-181905 A | 6/2002 |
| JP | 2003-315426 A | 11/2003 |
| JP | 2007-322414 A | 12/2007 |
| WO | WO2007/098167 A2 | 8/2007 |

OTHER PUBLICATIONS

Al-Yamani et al. "Seed Encoding with LFSRs and Cellular Automata", Design Automation Conference, 2003, Jun. 2-6, 2003, pp. 560-565.

(Continued)

*Primary Examiner* — James C Kerveros
(74) *Attorney, Agent, or Firm* — Bever, Hoffman & Harms, LLP; Jeanette S. Harms

(57) ABSTRACT

Scan testing and scan compression are key to realizing cost reduction and shipped quality. New defect types in ever more complex designs require increased compression. However, increased density of unknown (X) values reduces effective compression. A scan compression method can achieve very high compression and full coverage for any density of unknown values. The described techniques can be fully integrated in the design-for-test (DFT) and automatic test pattern generation (ATPG) flows. Results from using these techniques on industrial designs demonstrate consistent and predictable advantages over other methods.

7 Claims, 16 Drawing Sheets

(56) References Cited

U.S. PATENT DOCUMENTS

| | | | |
|---|---|---|---|
| 7,757,138 B2 | 7/2010 | Matsuo et al. | |
| 7,818,644 B2 | 10/2010 | Rajski et al. | |
| 7,913,137 B2 * | 3/2011 | Mukherjee et al. | 714/729 |
| 7,949,921 B2 * | 5/2011 | Gizdarski | 714/729 |
| 2002/0073373 A1 | 6/2002 | Nakao et al. | |
| 2004/0237015 A1 | 11/2004 | Abdel-Hafez et al. | |
| 2005/0060625 A1 | 3/2005 | Wang et al. | |
| 2005/0268194 A1 | 12/2005 | Wang et al. | |
| 2007/0033468 A1 | 2/2007 | Hilgendorf et al. | |
| 2007/0234163 A1 | 10/2007 | Mukherjee et al. | |
| 2007/0288821 A1 | 12/2007 | Matsuo et al. | |
| 2008/0294953 A1 | 11/2008 | Cheng et al. | |

OTHER PUBLICATIONS

Barnhart et al. "OPMSIR: The Foundation for Compressed ATPG Vectors", International Test Conference 2001, pp. 748-757.

Chiusano et al. "On Applying the Set Covering Model to Reseeding", Design, Automation and Test in Europe, Conference and Exhibition 2001, pp. 156-160.

Czysz et al. "Low Power Embedded Deterministic Test", 25th IEEE VLSI Test Symposium, 2007, May 6-10, 2007, pp. 75-83.

Czysz et al. "Low-Power Test Data Application in EDT Environment Through Decompressor Freeze", IEEE Transactions on Computer-Aided Design of Integrated Circuits and Systems, vol. 27, No. 7, Jul. 2008, pp. 1278-1290.

Dutta et al. "Using Limited Dependence Sequential Expansion for Decompressing Test Vectors", International Test Conference 2006, pp. 1-9.

Ferhani et al. "Classifying Bad Chips and Ordering Test Sets", IEEE International Test Conference 2006, pp. 1-10.

Hellebrand et al. "Built-In Test for Circuits with Scan Based on Reseeding of Multiple-Polynomial Linear Feedback Shift Registers", IEEE Transactions on Computers. vol. 44, No. 2, Feb. 1995, pp. 223-233.

Hellebrand et al. "Generation of Vector Patterns Through Reseeding of Multiple-Polynomial Linear Feedback Shift Registers", IEEE International Test Conference on Discover the New World of Test and Design, 1992, pp. 120-129.

Keller et al. "An Economic Analysis and ROI Model for Nanometer Test", IEEE International Test Conference, Oct. 26-28, 2004, pp. 518-524.

Koenemann et al. "A SmartBIST Variant with Guaranteed Encoding", Proceedings of the 10th Asian Test Symposium, 2001, pp. 325-330.

Lai et al. "A Reseeding Technique for LFSR-Based BIST Applications", Proceedings of the 11th Asian Test Symposium, 2002, pp. 200-205.

Mitra et al. "X-Compact: An Efficient Response Compaction Technique for Test Cost Reduction", International Test Conference, 2002, pp. 311-320.

Mitra et al. "X-Tolerant Signature Analysis", IEEE International Test Conference, 2004, Oct. 26-28, 2004, pp. 432-441.

Mrugalski et al. "New Test Data Decompressor for Low Power Applications", 44th ACM/IEEE Design Automation Conference 2007, pp. 539-544.

Patel et al. "Application of Saluja-Karpovsky Compactors to Test Responses with Many Unknowns", VLSI Test Symposium, IEEE 2003, pp. 107-112.

Rajski et al. "Automated Synthesis of Phase Shifters for Built-In Self-Test Applications", IEEE Transactions on Computer-Aided Design of Integrated Circuits and Systems, vol. 19, No. 10, Oct. 2000, pp. 1175-1188.

Rajski et al. "Convolutional Compaction of Test Responses", International Test Conference 2003, pp. 745-754.

Rajski et al. "Embedded Deterministic Test for Low Cost Manufacturing Test", International Test Conference 2002, pp. 301-310.

Rajski et al. "Synthesis of X-Tolerant Convolutional Compactors", 23rd IEEE VLSI Test Symposium, 2005, May 1-5, 2005, pp. 114-119.

Sharma et al. "X-Filter: Filtering Unknowns from Compacted Test Response", IEEE International Test Conference, 2005, Nov. 8, 2005, 9 pages.

Touba, "X-Canceling MISR—An X-Tolerant Methodology for Compacting Output Responses with Unknowns Using a MISR", IEEE International Test Conference 2007, Oct. 21-26, 2007, pp. 1-10.

Vermeulen et al. "Trends in Testing Integrated Circuits", IEEE International Test Conference 2004, pp. 688-697.

Vranken et al. "ATPG Padding and ATE Vector Repeat Per Port for Reducing Test Data Volume"International Test Conference, 2003, Sep. 30-Oct. 2, 2003, pp. 1069-1078.

Wohl et al. "Design of Compactors for Signature-Analyzers in Built-In Self-Test", IEEE International Test Conference, 2001, pp. 54-63.

Wohl et al. "Efficient Compression of Deterministic Patterns into Multiple PRPG Seeds", IEEE International Test Conference, 2005, Nov. 8, 2005, 10 pages.

Wohl et al. "Efficient Compression and Application of Deterministic Patterns in a Logic BIST Architecture", Design Automation Conference, 2003, pp. 566-569.

Wohl et al. "Fully X-Tolerant Combinational Scan Compression", IEEE International Test Conference 2007, pp. 1-10.

Wohl et al. "Minimizing the Impact of Scan Compression", 25th IEEE VLSI Test Symposium 2007, May 6-10, 2007, pp. 67-74.

Wohl et al. "X-tolerant Compression and Application of Scan-ATPG Patterns in a BIST Architecture", IEEE International Test Conference 2003, pp. 727-736.

* cited by examiner

FULLY X-TOLERANT, VERY HIGH SCAN COMPRESSION SCAN TEST SYSTEMS AND TECHNIQUES

RELATED APPLICATIONS

This application is a divisional of U.S. patent application Ser. No. 13/172,752 filed Jun. 29, 2011, entitled "Fully X-Tolerant, Very High Scan Compression Scan Test Systems And Techniques" which is a divisional of U.S. patent application Ser. No. 12/363,520 filed Jan. 30, 2009, entitled Fully X-Tolerant, Very High Scan Compression Scan Test Systems And Techniques" which claims priority of U.S. Provisional Patent Application 61/107,239, entitled "Fully X-Tolerant, Very High Scan Compression" filed Oct. 21, 2008.

BACKGROUND OF THE INVENTION

1. Field of the Invention

The present invention relates to scan testing of integrated circuits and, in particular, to compression techniques and structures usable during this scan testing.

2. Related Art

Larger and more complex logic designs in integrated circuits (ICs) lead to demands for more sophisticated testing to ensure fault-free performance of those ICs. This testing can represent a significant portion of the design, manufacture, and service cost of integrated circuits (ICs). In a simple model, testing of an IC can include applying multiple test patterns to the inputs of a circuit and monitoring its outputs to detect the occurrence of faults. Fault coverage indicates the efficacy of the test patterns in detecting each fault in a universe of potential faults. Thus, if a set of test patterns is able to detect substantially every potential fault, then fault coverage approaching 100% has been achieved.

To facilitate better fault coverage and minimize test cost, DFT (design-for-test) can be used. In one DFT technique, structures in the logic design can be used. Specifically, a logic design implemented in the IC generally includes a plurality of state elements, e.g. sequential storage elements like flip-flops. These state elements can be connected into scan chains of computed lengths, which vary based on the design. In one embodiment, all state elements in a design are scannable, i.e. each state element is in a scan chain. The state elements in the scan chains are typically called scan cells. In DFT, each scan chain includes a scan-input pin and a scan-output pin, which serve as control and observation nodes during the test mode.

The scan chains are loaded by clocking in predetermined logic signals through the scan cells. Thus, if the longest scan chain includes 500 scan cells, then at least 500 clock cycles are used to complete the loading process. Note that, in actual embodiments, software can compensate for different scan chain lengths, thereby ensuring that outputs from each test pattern are recognized and analyzed accordingly.

The test patterns for the scan chains can be generated using an external testing device. Using such a device, an exhaustive test can be done by applying $2^N$ input patterns to a design with N inputs and scan cells. However, this test approach is commercially impractical as the number of inputs increases.

To solve this problem, deterministic automatic test pattern generation (ATPG) can be used to generate a smaller set of patterns while providing fault coverage close to 100%. Specifically, in deterministic ATPG, each test pattern is designed to test for as many faults as possible. However, even with the reduction in test patterns, deterministic ATPG patterns still require significant storage area in the test-application equipment (tester) for the large number of patterns that are input directly to the scan chains, and for the expected output values from the scan chains. Moreover, this test method has associated inefficiencies because of its off-chip access time.

Alternatively, and more frequently in current, complex ICs, structures can be added to the design that allow the IC to quickly test itself. These built-in self-test (BIST) structures can include various pattern generators, the most typical being a pseudorandom pattern generator (PRPG). After the patterns generated by the PRPG are propagated through the scan chains in the tested design, the outputs are analyzed to determine if a fault is detected. An exemplary scan test system and technique using PRPG is described in U.S. Pat. No. 7,237,162, entitled "Deterministic BIST Architecture Tolerant Of Uncertain Scan Chain Outputs", which issued on Jun. 26, 2007 and is incorporated by reference herein.

To achieve high defect coverage during IC scan testing, particularly in light of shrinking process technologies and new IC materials, different fault models (e.g. stuck-at, transition delay, and shorts/opens models) may be used. Unfortunately, although test patterns for timing dependent and sequence dependent fault models are increasingly important for new technologies, such test patterns can require 2-5 times more tester time and data. Current increases in test data volume and test application time are projected to continue for at least an order of magnitude for next generation tools. Therefore, scan-alone scan testing has become insufficient as a method to control test costs. Even highly compacted vector sets generated with modern ATPG require on-chip compression and decompression to reduce test cost.

Scan compression lowers test cost by reducing test pattern volume, test application time, and tester pin count requirements. Scan load compression techniques exploit the scarcity of "care" bits (i.e. values stored in predetermined scan cells that can achieve detection of targeted faults) in scan input data compared to the "don't care" bits (i.e. those bits that do not indicate faults in the tested design). Scan unload compression techniques exploit the fact that error values appear more or less randomly, and only on a few scan chains at a time. Specifically, the tested design can occasionally output uncertain bits in addition to care bits and don't care bits. As the name implies, an uncertain bit (called an "X" herein) has a value that is unknown (i.e. a value that cannot be accurately predicted by the simulation used during the ATPG process). As a result, X bits can corrupt the analysis of the scan outputs. Moreover, such X bits can limit unload compression by masking observation, and can also limit load compression by requiring additional care bits to prevent Xs or avoid their effect on scan outputs.

Unfortunately, aggressive designs and technologies as well as sophisticated fault models can increase the number of scan cells that capture an X value. Static Xs generally refer to unknown values seen in a zero-delay simulation that are insensitive to operating parameters. Exemplary static Xs include un-modeled blocks (e.g. analog or memory blocks) and bus contentions. Although static Xs are known at design time, most do not have simple fixes. Additionally, "dynamic" Xs may result because of timing, operating parameters (e.g. voltage and temperature) or manufacturing defects.

Therefore a need arises for a scan compression method that can simultaneously meet several aggressive goals.

SUMMARY OF THE INVENTION

A system for testing an integrated circuit (IC) design including a plurality of scan chains is provided. This scan test system can include two pseudo-random pattern generator (PRPG) processing chains and an unload block. The first PRPG processing chain can receive a first seed to generate patterns for identifying faults of the design. That is, the patterns are applied to the plurality of scan chains. The second PRPG processing chain can receive a second seed to generate X-tolerant (XTOL) control bits, the XTOL control bits determining a level of observability of the scan chains. The unload block can receive the scan outputs from the plurality of scan chains and the XTOL control bits, and generate test outputs for analyzing the design.

In one embodiment, the first PRPG processing chain can include a CARE PRPG and a CARE phase shifter. The CARE PRPG can receive the first seed. The CARE phase shifter can provide decompressed outputs to the plurality of scan chains. The first PRPG processing chain can also include a CARE shadow register, which receives inputs from the CARE PRPG and provides outputs to the CARE phase shifter. The CARE PRPG can provide a Pwr_ctrl (power control) signal that puts the CARE shadow register in a hold mode so that constant values are shifted into the scan chains to reduce shift power.

The second PRPG processing chain can include an XTOL PRPG, an XTOL phase shifter, and an XTOL shadow register. The XTOL PRPG can receive the second seed. The XTOL phase shifter can receive the outputs of the XTOL PRPG. The XTOL shadow register can receive outputs of the XTOL phase shifter and provide the XTOL control bits. In one embodiment, the XTOL PRPG is configured to generate a hold signal that puts the XTOL shadow register in hold mode.

The scan test system can further include an addressable PRPG shadow configured to receive inputs from a tester and to provide outputs to one of the first PRPG processing chain and the second PRPG processing chain. The CARE PRPG and the XTOL PRPG are configured for reseeding, when needed, at any shift cycle. Therefore, the scan test system can advantageously provide a per-shift X-control.

In one embodiment, the unload block can include an XTOL selector, an X-decoder, a compressor, and a multiple-input shift register (MISR). The XTOL selector can receive the internal scan chain outputs. The X-decoder can control the XTOL selector using the XTOL control bits. The compressor can receive the outputs of the XTOL selector. The MISR can receive the outputs of the compressor and generate the test outputs. Advantageously, the XTOL selector and the X-decoder can be configured to provide one of a full observability mode, a no observability mode, a single chain mode, and a multiple observability mode.

In one embodiment, the X-decoder can include the first of a two-level decoding system. For example, at a first level, the X-decoder provides per-group (not per-chain) outputs. At the second level, group-to-chain decoding is performed at each individual chain. A first AND gate can receive a first input from a scan chain and a multiplexer can provide a second input to the first AND gate. A second AND gate and an OR gate can both receive the XTOL control bits, wherein the multiplexer selects an output from one of the second AND gate and the OR gate.

The above-described scan test system can advantageously adapt to any X density, from 0 to almost 100%, and can provide very high compression with the same test coverage as optimized scan ATPG. As few as a single scan input and scan output can be defined. Advantageously, the design logic can remain unchanged, thereby facilitating the incorporation of the above-described scan test system.

A method for mapping care bits to a CARE pseudo-random pattern generator (PRPG) is also provided. This method includes determining a maximal window of shifts for which all care bits are mappable to a single seed. Determining the maximal window can include sorting the care bits by shift cycle, and for each shift cycle, computing a maximal window so that the total number of care bits in a window does not exceed a pre-computed limit. When all care bits in the window are mappable to a single seed, then the single seed can be loaded into the CARE PRPG. When not all care bits are mappable to the single seed, then the window can be linearly decreased.

A method for mapping X-tolerance (XTOL) control bits to an XTOL pseudo-random pattern generator (PRPG) is also provided. This method includes determining a maximal window of shifts for which all XTOL control bits are mappable to a single seed as well as determining an optimal start for the maximal window. For a full observability mode, the method can further include determining whether a first option of turning off an XTOL enable bit or a second option of leaving the XTOL enable bit on is better, and then selecting the better option.

A method of selecting observability modes for a scan test is also provided. This method can include initializing mode merits associated with the observability modes. For each shift, any observability mode that lets an unknown value (X) through can be eliminated. Additionally, any observability mode that fails to detect a primary target of the scan test can also be eliminated. Mode merits can be increased for secondary faults based on a number of secondary targets observed. For each shift, a best observability mode and a second best observability mode for a shift based on total mode merits can be determined. The resulting observability modes can be mapped to XTOL seeds. The observability modes can include full observability, no observability, single observability, and multiple observability (and their complements).

DETAILED DESCRIPTION OF THE FIGURES

Figure 1:
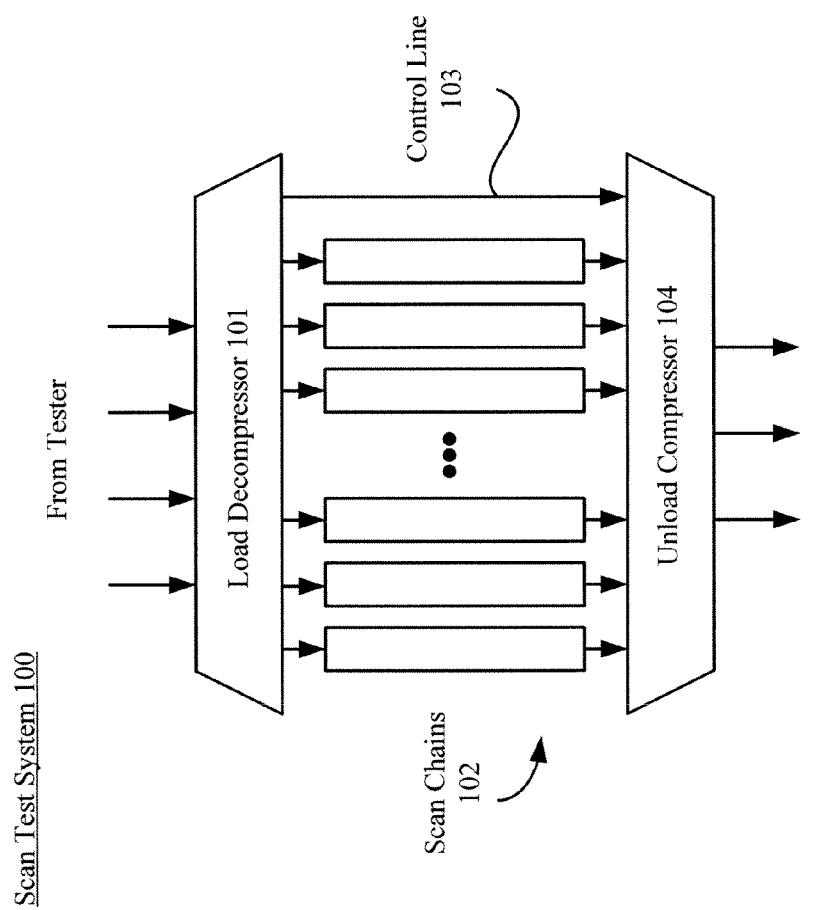
FIG. 1 illustrates a simplified scan test system with an on-chip compressor and a decompressor.

FIG. 1 illustrates a simplified, prior art test system 100 including a load decompressor 101 for receiving inputs (i.e. seeds) from a tester, a plurality of scan chains 102 for receiving scan bits generated by load decompressor 101, and an unload compressor 104 for receiving the scan outputs from scan chains 102. In one embodiment, load decompressor 101 can include a pseudo-random pattern generator (PRPG) because a PRPG repeatedly re-seeded with deterministic ATPG-computed values from the tester can advantageously provide very high load data compression. Note that load values computed during deterministic ATPG can be "encoded" as (or "mapped" to) PRPG states so that all care bits are properly loaded in the PRPG seed. In typical embodiments, multiple test patterns can be generated from each PRPG seed.

In addition to care bits necessary for fault detection, load decompressor 101 can also supply X-control bits, which are provided to unload compressor 104 via a control line 103. Although unload compressor 104 can ensure error detection in the presence of a few Xs, additional Xs can result in test coverage loss unless excessive Xs are controlled with bits derived from load decompressor 101. Notably, adding X-control bits can actually reduce the total compressed data volume if the added XTOL control bits are fewer than the output bits required if Xs were not controlled.

However, determining which X-control bits are needed can be challenging. To reduce test application time, the load of a scan pattern can be overlapped with the previous unload. Therefore, load decompressor 101 must simultaneously supply load care bits for the current pattern (which is provided to scan chains 102) as well as the X-control bits for the previous unload so that excessive Xs do not cause a loss of coverage or an unacceptable increase in pattern count.

Unfortunately, the X-control bits are not known until too late in a typical scan ATPG flow. That is, the X-control bits are known only after load care bits have been set for the previous M (e.g. 32) patterns and, at this time, conflicts in load decompressor 101 may result in unsatisfiable conditions. Note that previous pattern information can be stored, per scan cell, to predict which cells are likely to require X-control for observation. However, this storage requires additional memory and CPU effort. Moreover, when the prediction fails, a padding pattern may be needed, which undesirably adds to both test data and cycles. In one embodiment, X-control bits can be limited to a single set per load of internal chains, i.e. unchanged for all shift cycles, with the disadvantage of possibly over-masking Xs and thus increasing pattern count to achieve full coverage.

Figure 2A:
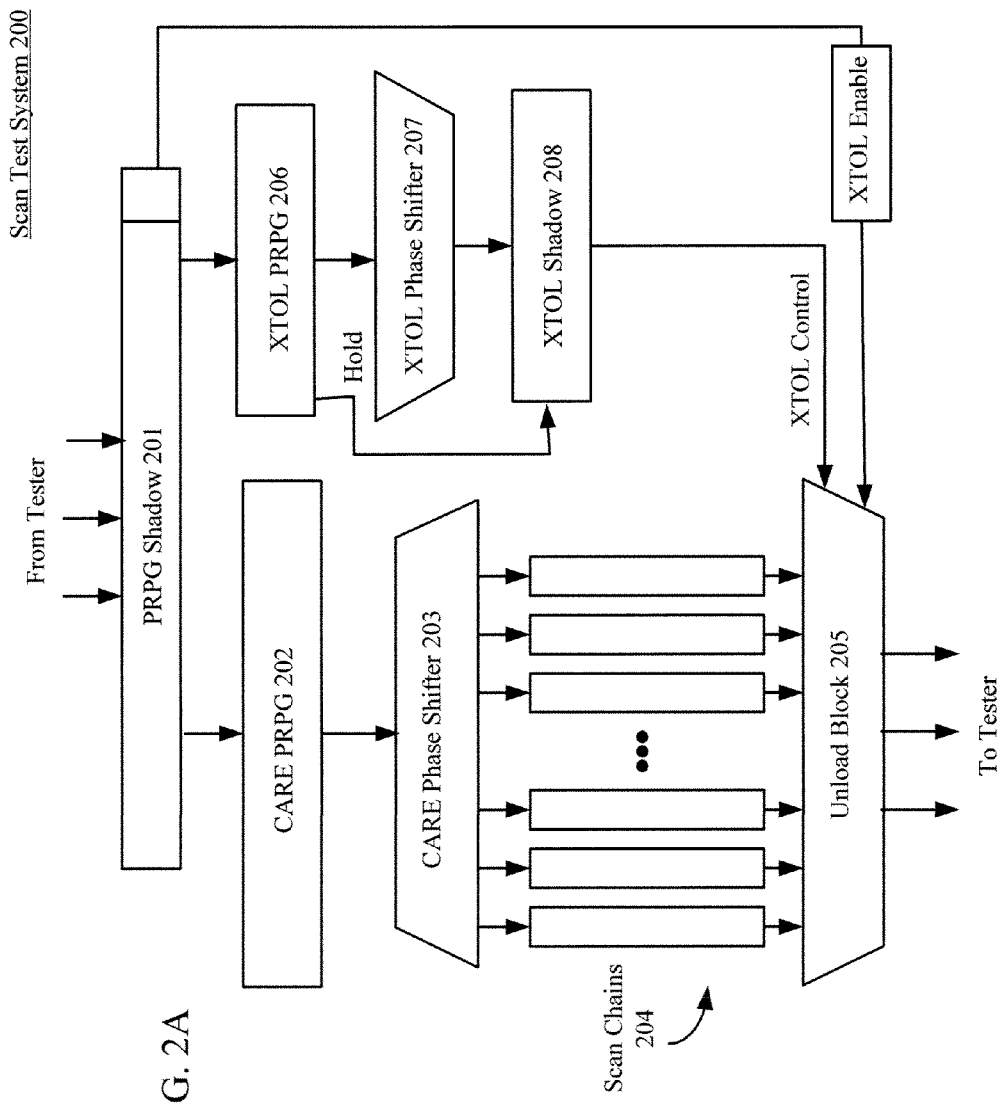
FIG. 2A illustrates a scan test system configured to provide full X-tolerance.

In accordance with one aspect of a scan test system 200 shown in FIG. 2A, dual PRPGs can be used to provide a per-shift control of the X bits while avoiding conflicts with load care bits. To provide this optimization, a care bit PRPG (CARE PRPG) 202 can produce care (and don't care) bits and a separate X-tolerant PRPG (XTOL PRPG) 206 can produce XTOL control bits. Note that a PRPG shadow register 201 can receive seeds from the tester and generate appropriate seeds for either of CARE PRPG 202 or XTOL PRPG 206.

Figure 3A:
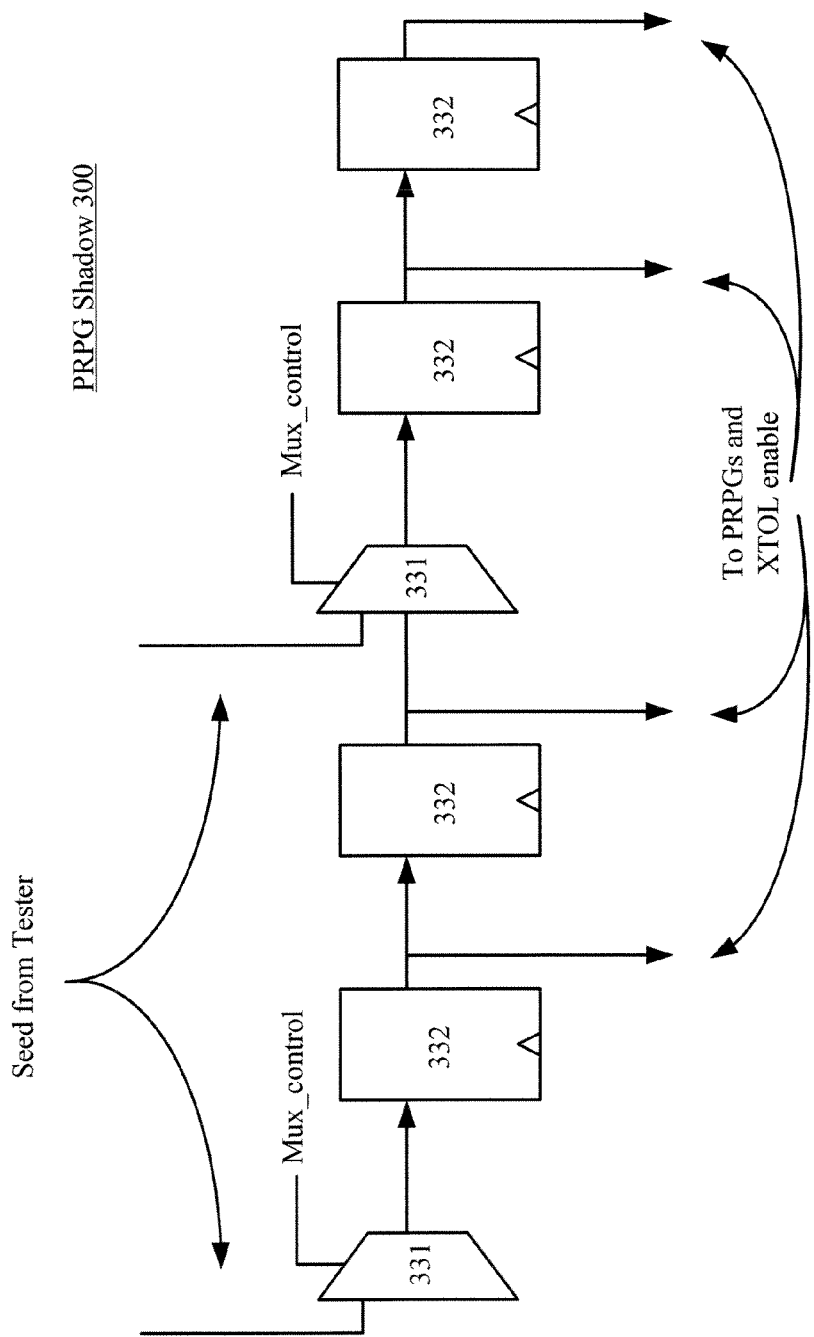
FIG. 3A illustrates an exemplary PRPG shadow register.

FIG. 3A illustrates a simplified PRPG shadow register 330 including multiplexers 331 and flip-flops 332. Multiplexers 331, which are controlled by the same control signal Mux_control, receive seeds from the tester as well as from the previous cell, when available. Flip-flops 332, which are clocked by the same clock (not shown for simplicity), receive an output of a flip-flop 332 of the previous cell or a multiplexer 331 of the previous cell. U.S. Pat. No. 7,237,162 describes in further detail an exemplary configuration for a PRPG shadow register. The outputs of PRPG shadow register 300, i.e. bits for XTOL enable and either the CARE PRPG or the XTOL PRPG, are provided by flip-flops 332.

Referring back to FIG. 2A, CARE PRPG 202 can provide its output to a CARE phase shifter 203, which can have more outputs than inputs. Thus, in combination, CARE PRPG 202 and CARE phase shifter 203 can provide load decompression for the care (and don't care) bits. In a contrasting configuration, XTOL PRPG 206 can provide its output to an XTOL phase shifter 207, which can include more inputs than outputs.

Note that a PRPG is effectively a shift register with a predetermined feedback configuration. Therefore, adjacent cells of the PRPG have a dependency on one another, i.e. a second cell that is downstream of a first cell can store a value that was previously stored by the first cell one clock before. Phase shifters, which are typically implemented using XOR gates that receive inputs from predetermined cells, reduce the linear dependency between adjacent cells of the PRPG so that fault detection is minimally deterred by the linear dependencies of the PRPG. The various configurations of a PRPG and a phase shifter are known to those skilled in the art of IC testing and therefore are not explained in detail herein.

In one embodiment, PRPG shadow register 201 can provide an XTOL enable bit (which can be stored in a one-bit register) to turn off XTOL tolerance in an unload block 205. Turning off the enable bit can reduce compressed data volume by not requiring XTOL PRPG bits for a window of adjacent shift cycles that need no X control. XTOL PRPG 206 continues to shift, but its control over unload block 205 can be disabled by the XTOL enable signal. When enabled, XTOL PRPG 206 can provide per-shift X-control to unload block 205.

In one embodiment, the XTOL enable bit can be changed only when either CARE PRPG 202 or XTOL PRPG 206 is reseeded. Therefore, the XTOL Enable bit can significantly reduce XTOL bits for designs with very low X densities, but provides relatively coarse control. To further reduce XTOL bits for medium and high X densities, a finer control can also be provided. Notably, X distribution is highly uneven in most designs, thereby allowing the XTOL control bits to be re-used for adjacent cycles (and the pattern as generated by ATPG can be tuned to favor re-use). Therefore, in accordance with one embodiment, a dedicated channel of XTOL PRPG 206 can provide a Hold bit to XTOL shadow register 208. This Hold bit ensures that the XTOL PRPG data in XTOL shadow register 208 is kept unchanged.

Note that while XTOL shadow register 208 provides constant XTOL control bits to unload compressor 205, XTOL PRPG 206 can advance to the next state when a new set of XTOL control bits is needed. In one embodiment, a single bit per shift is needed from XTOL phase shifter 207 to control XTOL shadow register 208.

As described above, XTOL phase shifter 207 advantageously has fewer outputs than inputs. Therefore, placing XTOL shadow register 208 on the output of XTOL phase shifter 207 (rather than on the output of XTOL PRPG 206) results in a much smaller shadow register. In one embodiment, the number of XTOL-control bits is about log(# scan chains). Also, the long combinational path from XTOL PRPG 206 to unload block 205 is greatly reduced by placing XTOL shadow register 208 after XTOL phase shifter 207.

Figure 3B:
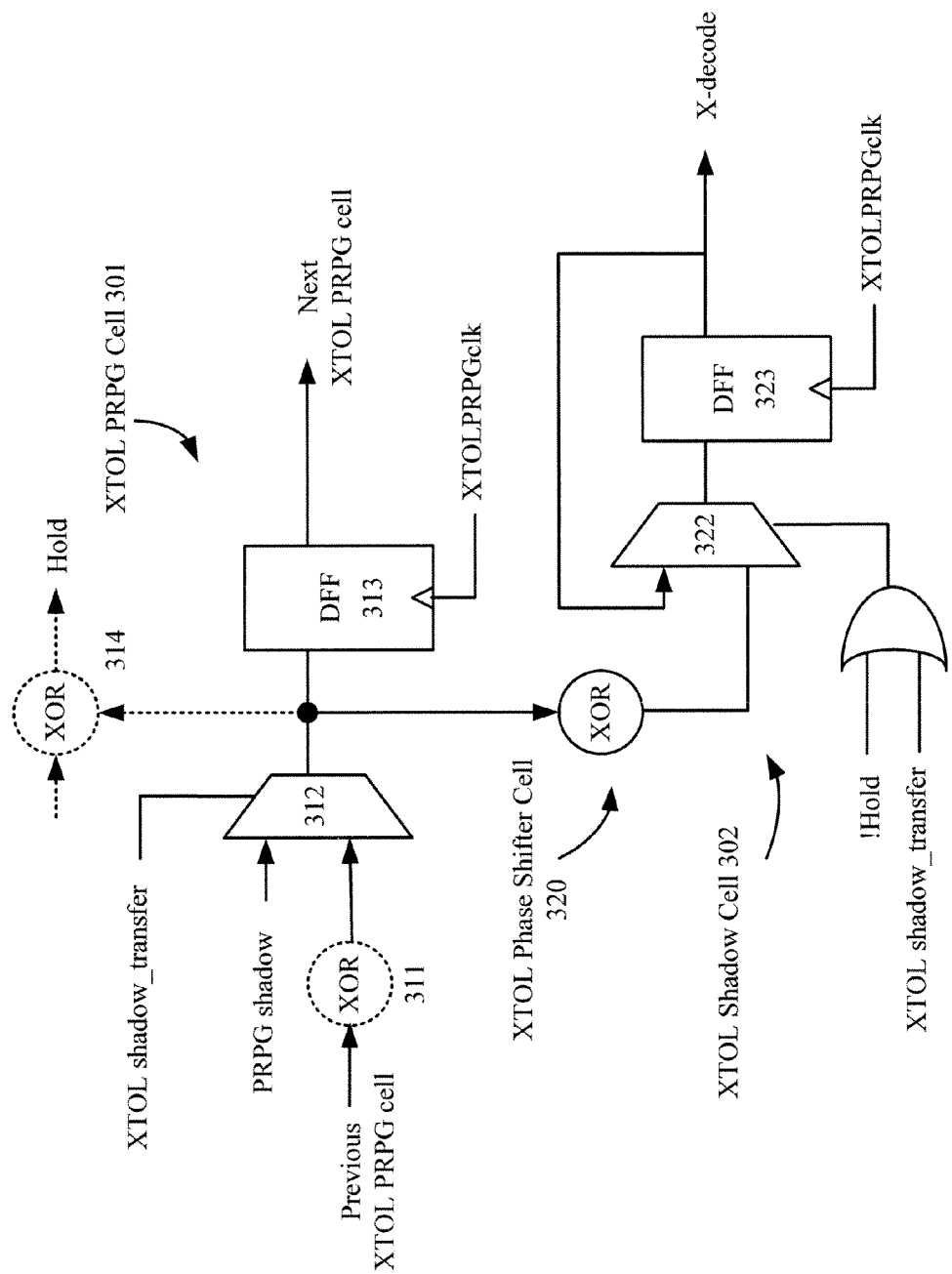
FIG. 3B illustrates an exemplary cell of the XTOL PRPG and its corresponding cells of the XTOL phase shifter and the XTOL shadow register.

FIG. 3B illustrates an exemplary cell of XTOL PRPG 206 and its corresponding cells of XTOL phase shifter 207 and XTOL shadow register 208. In one embodiment, a cell 301 of the XTOL PRPG can include a multiplexer 312 that receives as inputs a bit from the PRPG Shadow (e.g. PRPG shadow 201, FIG. 2A) as well as a bit from the previous XTOL PRPG cell (note that an XOR gate, may be generating the output of the previous XTOL PRPG cell, as indicated by optional XOR 311). Selecting between these bits is determined by an XTOL shadow_transfer signal, which is generated by the test. In one embodiment, multiplexer 312 selects the PRPG shadow input when the XTOL shadow_transfer is on. Cell 301 can further include a clocked storage device (e.g. a D-flip-flop) 313, which receives the selected output bit of multiplexer 312 and provides a signal to the next XTOL PRPG cell.

A cell 320 of the XTOL phase shifter can include an XOR gate, which receives as inputs at least the selected output of multiplexer 312. In one embodiment, to provide the phase shifting functionality, this XOR gate can also receive at least one other multiplexer output from another XTOL PRPG cell. Note that each phase shifter channel shown in FIG. 3B can have a unique combination of cells that are used to generate a phase shifted output. The selection of cells for each combination is known to those skilled in the art and therefore is not explained in further detail herein.

In one embodiment, a cell 302 of the XTOL shadow register can include a multiplexer 322 that receives as inputs the output of cell 320 and a feedback signal. In one embodiment, selecting between these bits is determined by a !Hold signal (i.e. the opposite of the Hold signal) ORed with an XTOL shadow_transfer signal, which is generated by the test. Specifically, in one embodiment, multiplexer 322 selects the output of XTOL phase shifter cell 320 when the XTOL shadow_transfer is on or when not holding. Multiplexer 322 selects the feedback from storage device 323 when holding.

Cell 302 can further include a clocked storage device (e.g. a D-type flip-flop) 323 that receives the selected output of multiplexer 322 and provides an X-decode signal. Note that this X-decode signal is the feedback signal provided as an input to multiplexer 322. Note further that storage devices 313 and 323 can be controlled by a same clock signal, i.e. XTOLPRPGclk.

In this configuration, multiplexer 322 can advantageously function as a re-circulating multiplexer that holds data in the XTOL shadow, or captures data from XTOL PRPG 206 to XTOL shadow register 208. In one embodiment, when the PRPG shadow input is selected by multiplexer 312, the input from XTOL phase shifter cell 320 is selected by multiplexer 322. Further, when the previous PRPG cell input is selected by multiplexer 312, the output of cell 320 of the phase shifter is selected by multiplexer 322, or the output of 323, depending on the Hold signal. To provide an immediate refresh of the XTOL shadow with a new set of XTOL-controls, the XTOL phase shifter inputs are taken from the input of XTOL PRPG cells (unlike the traditional configuration with the phase shifter connected to the output of PRPG cells).

Note that a subset of the total XTOL PRPG cells can be used to generate the Hold signal. For example, as shown in FIG. 3B, the output of multiplexer 312 and at least one other similar output can be provided to a phase-shifting element 314. In one embodiment, phase-shifting element 314 can include an XOR gate. The output of phase-shifting element 314 is the Hold signal.

Note further that although an intermediate XTOL PRPG cell 301 is shown, the first and last XTOL PRPG cells have similar configurations with the following exceptions. Specifically, the first XTOL PRPG cell includes a multiplexer 312 that, instead of receiving an input from the previous XTOL PRPG cell, receives an output of the last XTOL PRPG cell. It logically follows that the last XTOL PRPG cell includes a storage device 313 that, instead of providing an output to the next XTOL PRPG cell, provides an output to the first XTOL PRPG cell.

Figure 2B:
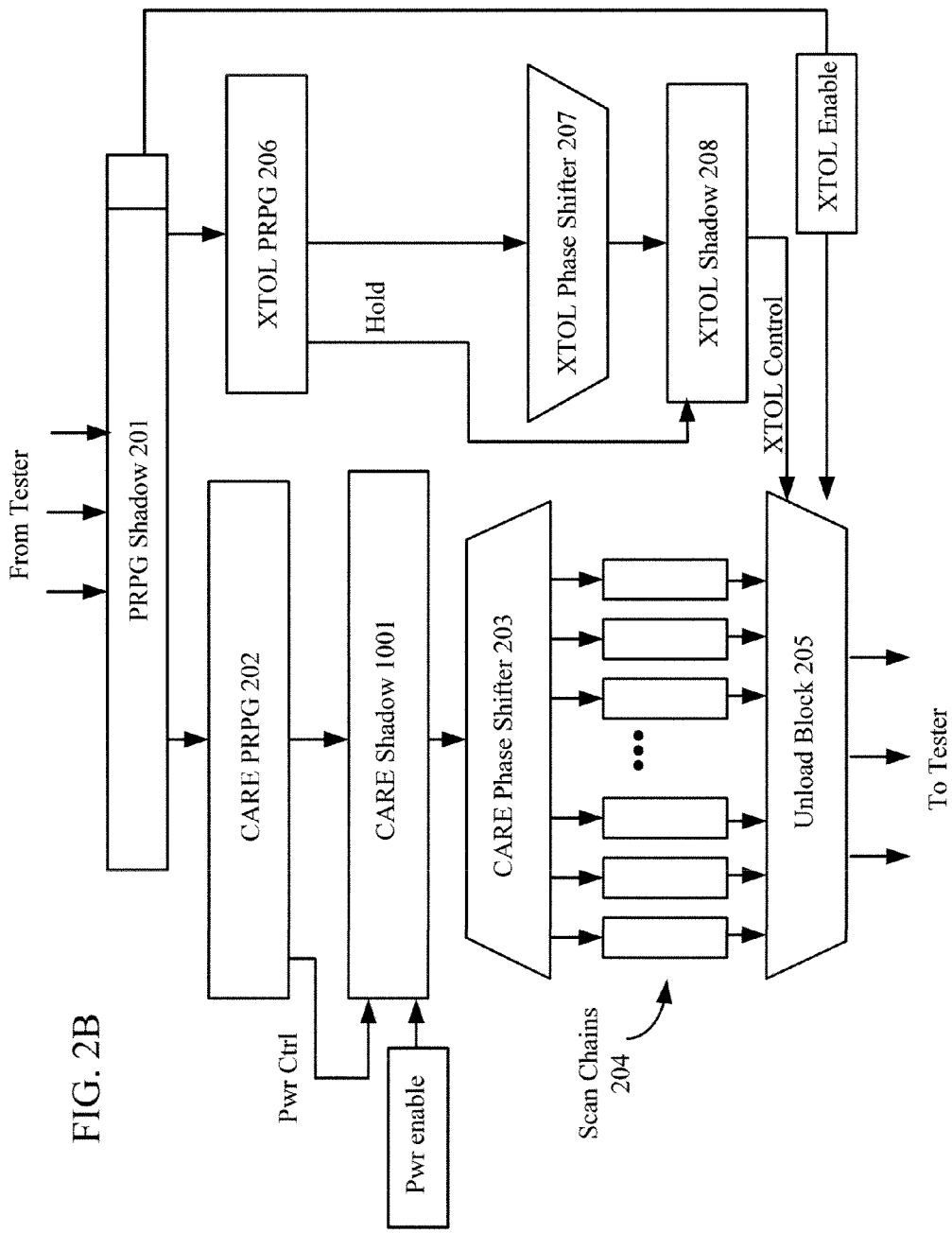
FIG. 2B illustrates the scan test system of FIG. 2A further including a CARE shadow register.
Figure 3C:
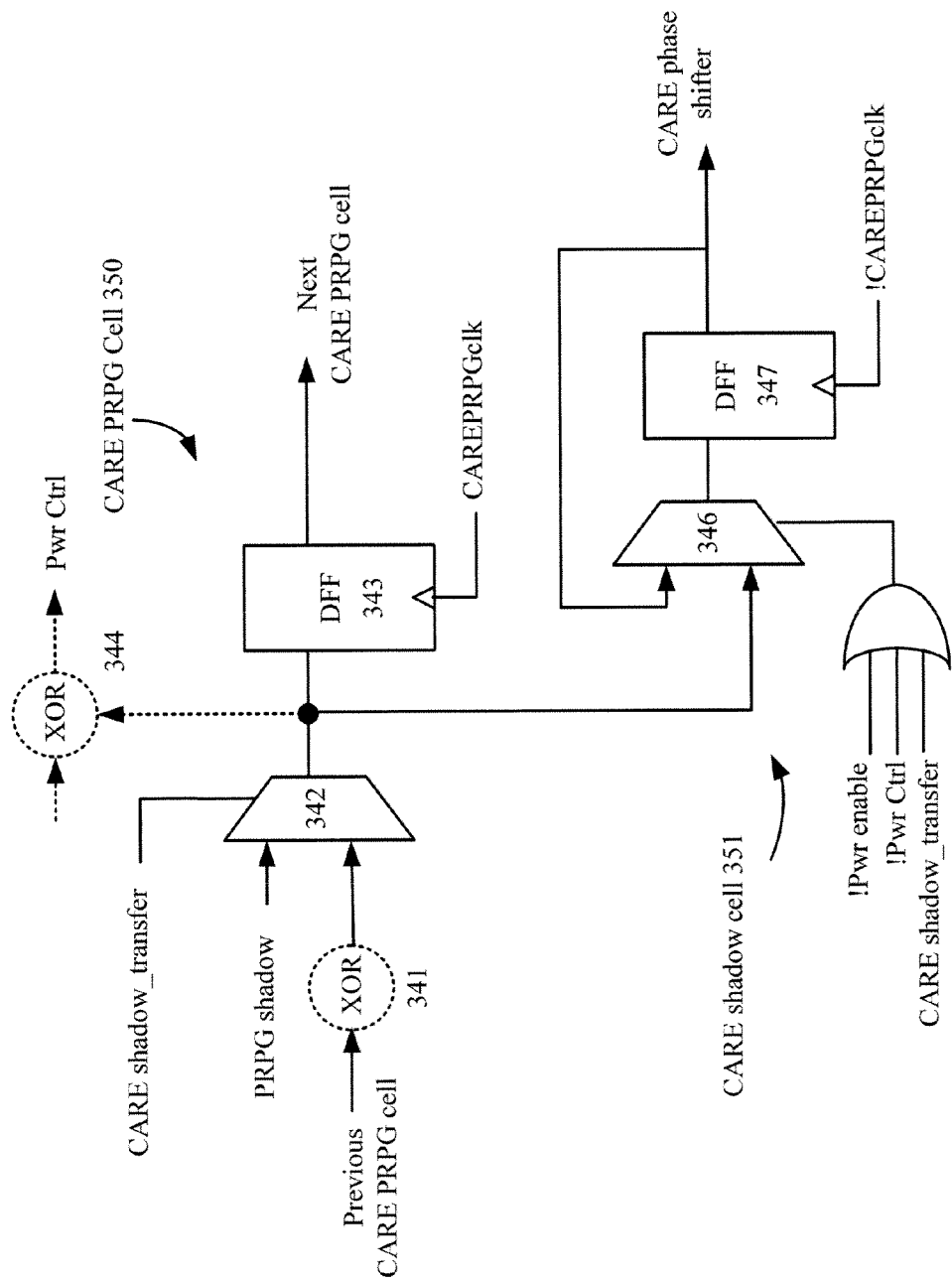
FIG. 3C illustrates an exemplary cell of the CARE PRPG and its corresponding cells of the CARE phase shifter and the CARE shadow register.

In one embodiment shown in FIG. 2B, a CARE shadow register can be included in scan test system 200 (FIG. 2A). FIG. 3C illustrates an exemplary cell of CARE PRPG 202 and its corresponding cell of CARE shadow 1001. In one embodiment, a cell 350 of the CARE PRPG can include a multiplexer 342 that receives as inputs a bit from the PRPG Shadow (e.g. PRPG shadow 201, FIG. 2A) as well as a bit from the previous CARE PRPG cell (note that an XOR gate, may be generating the output of the previous XTOL PRPG cell, as indicated by optional XOR 341). Selecting between these bits is determined by a CARE shadow_transfer signal, which is generated by the tester. Cell 350 can further include a clocked storage device (e.g. a D-flip-flop) 343, which receives the selected output bit of multiplexer 342 and provides a signal to the next CARE PRPG cell.

Note that a subset of the total CARE PRPG cells can be used to generate a power control signal. For example, as shown in FIG. 3C, the output of multiplexer 342 and at least one other similar output can be provided to a phase-shifting element 344. In one embodiment, phase-shifting element 344 can include an XOR gate. The output of phase-shifting element 344 is the Pwr Ctrl signal.

In one embodiment, a cell 351 of the CARE shadow register can include a multiplexer 346 that receives as inputs the output of multiplexer 342 and a feedback signal. In one embodiment, selecting between these bits is determined by ORing a !Pwr enable signal (i.e. the opposite of the Pwr enable signal (which is a global power signal provided by the tester and stored, for example, in a one-bit register)), a !Pwr Ctrl signal, and a CARE shadow_transfer signal (which is generated by the tester).

Cell 351 can further include a clocked storage device (e.g. a D-type flip-flop) 347 that receives the selected output of multiplexer 346 and provides an output to a corresponding cell of CARE phase shifter 203. Note that this output is the feedback signal provided as an input to multiplexer 346. Note further that storage devices 343 and 347 are controlled by a same clock signal, i.e. CAREPRPGclk, which is inverted for clocked storage device 347.

In one embodiment, if the Pwr enable signal is 0, then the Pwr control signal and the CARE shadow transfer signal are ignored, and CARE shadow cell 351 copies the content of CARE PRPG cell 350 as output by multiplexer 342. However, if the Pwr enable signal is 1, then the Pwr ctrl signal and the CARE shadow_transfer signal determine whether CARE shadow cell 351 holds its current value or clocks in a new value from CARE PRPG cell 350. Advantageously, this configuration of CARE PRPG cell 350 and CARE shadow cell 351 can provide significant power reductions by shifting in repeated values into the scan chains. Specifically, any don't care shifts can be used to trade off care bits versus power.

Referring back to FIG. 2A, PRPG shadow register 201 can be characterized as an addressable shadow with arbitrary overlap. Specifically, PRPG shadow register 201 can advantageously load the next CARE seed for CARE PRPG 202 or the next XTOL seed for XTOL PRPG 206. Notably, this loading can be performed while shifting or holding the values of scan chains 204, thereby allowing reseed cycles with arbitrary overlap with internal shift cycles. Thus, the reseeding frequency is not limited by the number of cycles necessary to load a seed. Advantageously, the content of PRPG shadow

201 can then be transferred, in a single cycle, to either CARE PRPG 202 or XTOL PRPG 206.

Optimized scan ATPG can significantly reduce pattern count by merging multiple faults to be tested by every pattern. At first, merging is very effective and each pattern uses a large number of care bits to test a large number of faults. As the number of yet untested faults decreases with each subsequent test pattern generated, opportunities to merge faults per pattern diminish rapidly, so fewer and fewer care bits per pattern are used. Care bits are mapped to seeds, so initial patterns require a large number of seeds, while later patterns need fewer and fewer seeds. On the other hand, testers are optimally configured to supply a constant number of bits per load.

The PRPG shadow 201 can be repeatedly reseeded from the tester to obtain the desired deterministic test. Alternately, PRPGs 202 and 206 can continuously receive a stream of tester data (in which every test cycle provides a subset of the total number of bits that can be stored in PRPG shadow 201, i.e. an incremental reseed) so that desired care bits are produced. However, designs can have care-bit hot spots, i.e. areas that require a significant number of care bits for many test patterns. Because of limited tester bandwidth, only a few data values can be provided to the PRPG every shift cycle, which may be insufficient to satisfy all care bits. In this case, the load of scan chains 204 should be stopped for some cycles.

Therefore, in one embodiment, reseeding of PRPG shadow 201 can be used to avoid the complexities stemming from streaming data across pattern boundaries (i.e. dealing with an incremental reseed can be significantly more complex than working with a new, complete seed). Moreover, to maintain independence between loads, each pattern load can be started with a full CARE PRPG load. To maximize the number of care bits available every shift, reseeding can be combined with the ability to stop the shifting of scan chains 204 when needed. In one embodiment, a new seed can be loaded as often as every shift (if needed), thereby maximizing the supply of values to PRPG shadow 201 independent of tester bandwidth.

Thus, in light of the reseeding of PRPG shadow 201, either CARE PRPG 202 or XTOL PRPG 206 can be reseeded when needed, at any shift cycle. If needed, the shifting of scan chains 204 can be stopped while reseeding CARE PRPG 202 and/or XTOL PRPG 206. This overlap of the reseeding of PRPG shadow 201 and the shifting of scan chains 204 can be determined by ATPG.

In one embodiment, CARE PRPG 202 and XTOL PRPG 206 are the same length so each tester load (seed) has the same amount of data. As noted above, PRPG shadow 201 can be one bit longer than either CARE PRPG 202 or XTOL PRPG 206 because PRPG shadow 201 includes the XTOL enable bit. Note that when the content of PRPG shadow 201 is transferred (in parallel) to either CARE PRPG 202 or XTOL PRPG 206, the XTOL enable bit is set and remains unchanged until the next shadow transfer.

Figure 4:
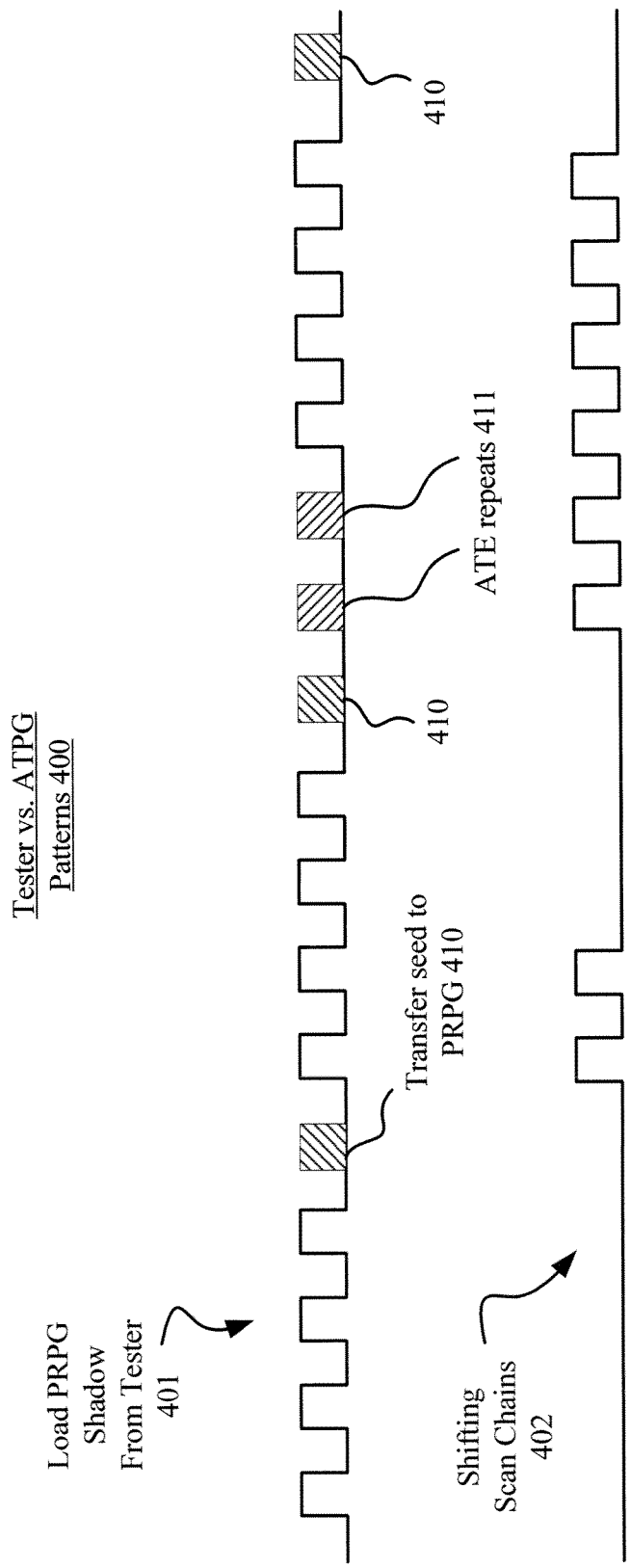
FIG. 4 illustrates exemplary waveforms associated with tester and ATPG patterns.

Notably, seeds are loaded only when needed. The tester views each reseed as a fixed-sized load; internally, one or more seeds control an internal load/unload operation. FIG. 4 illustrates exemplary waveforms 400 associated with tester and ATPG patterns. Waveform 401 can represent loading a PRPG shadow from a tester. Waveform 402 can represent the shifting of the scan chains based on the ATPG pattern load. As shown by these waveforms, if the number of cycles to load a seed is 4 (shown by waveform 401), the first 4 cycles of a pattern load a seed, followed by a cycle to transfer the seed to the CARE PRPG (see cycle 410), then the internal chains shift for 2 cycles (shown by waveform 402) and wait 2 more cycles for the second seed to complete loading. Internal shift then resumes and, after 2 cycles, the third seed starts loading, overlapped with internal (i.e. scan cell) shifting. In this embodiment, the tester supplies equal patterns, 4 loads followed by a transfer, or repeated tester cycles (shown by cycles 411). Note that the internal load can require multiple seeds, is independent of the external view, and could use a faster or slower clock.

Referring back to FIG. 2, scan test system 200 can simultaneously uses three compression techniques. First, test generation can merge multiple faults per pattern because CARE PRPG 202 can be reseeded as often as needed, even every shift. Encoding few, dense patterns into seeds (multiple seeds to a pattern) results in less total data than encoding many, sparse patterns. Thus, ATPG can advantageously "re-use" care bits for multiple faults in a pattern. Second, PRPG encoding of care bits can provide very high data compression. Notably, separate CARE and XTOL PRPGs allow independent optimization of compression for both care and XTOL control bits. Third, tester repeat cycles can be used as a no-overhead, stand-alone load data compression technique. In one embodiment, tester repeats can be used to shift the values of scan chains 204 when no reseed is in progress.

Figure 5:
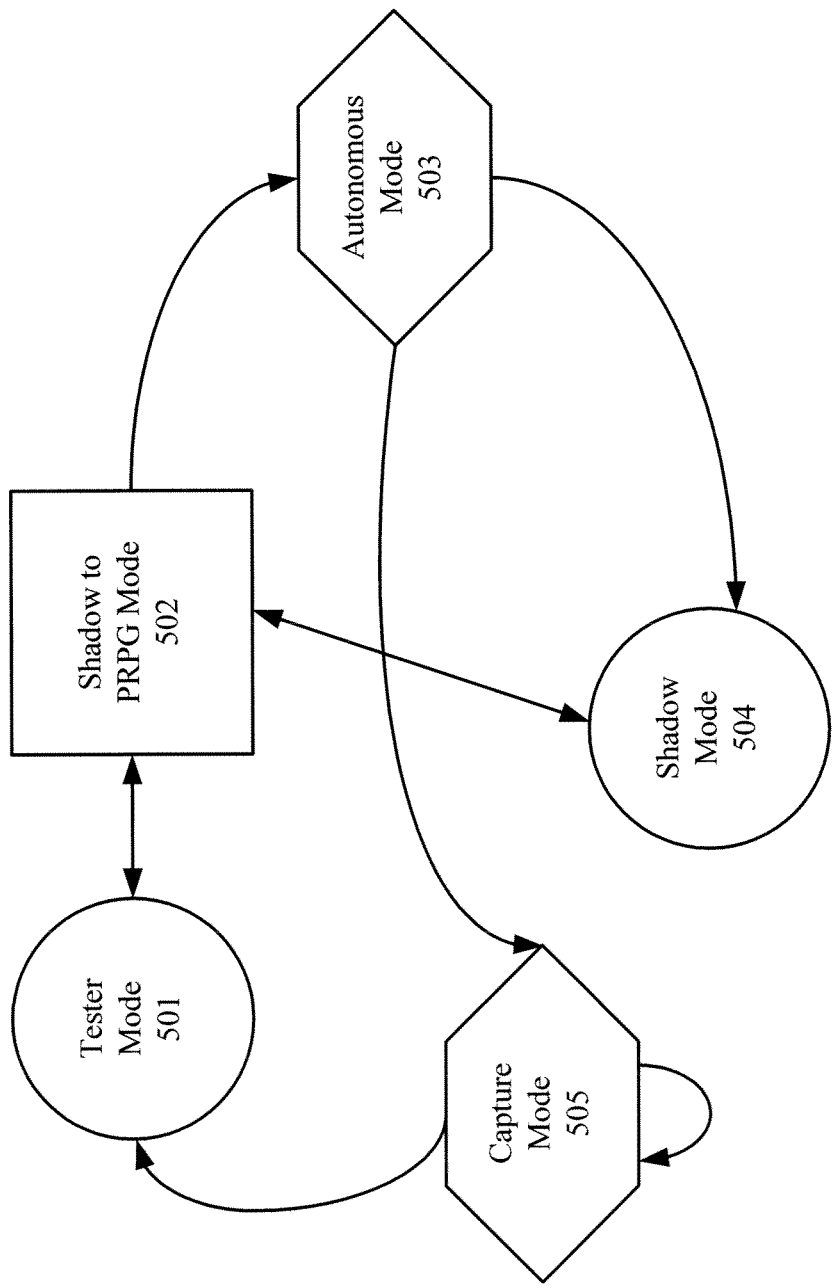
FIG. 5 illustrates an exemplary state flow of applying compressed patterns.

FIG. 5 illustrates an exemplary state flow of applying compressed patterns. Patterns start in "Tester Mode" 501 in which the first seed is loaded to the PRPG shadow and, optionally, data unloaded. Note that the first seed is designated for the CARE PRPG because each pattern needs load care bits, but may not need XTOL bits. Internal chains do not shift during "Tester Mode" 501. Instead, the internal chains hold values. In one embodiment, "Tester Mode" 501 can take #shifts/seed cycles (i.e. the number of cycles needed to reload the PRPG shadow) (e.g. the first four cycles in FIG. 4 of waveform 401) The PRPG shadow content is then transferred, in one cycle, to either the CARE or XTOL PRPG in the "Shadow to PRPG Mode" 502.

There are three possible next stages when in the "Shadow to PRPG Mode" 502. If another seed is immediately needed (e.g. an XTOL seed after the initial CARE seed), then "Tester Mode" 501 can be re-entered. If another seed is needed after a few cycles, a "Shadow Mode" 504 can be entered. Finally, if another seed will not be needed for some cycles, then an "Autonomous Mode" 503 can be entered.

"Shadow Mode" 504 can be used when another seed is needed in C cycles and C #shifts/seed (i.e. the number of cycles needed to re-load the PRPG shadow). For C cycles, loading the PRPG shadow from the tester overlaps with shifting the internal chains (i.e. the #shifts/seed−C). In "Shadow Mode" 504, the PRPG shadow can be used to minimize the total number of test cycles by overlapping as much as possible with internal shift load. In turn, the ATPG process can be tuned to space reseeds as much as possible to maximize overlapping. In one embodiment, "Shadow Mode" 504 takes #shifts/seed cycles (e.g. 4 cycles in FIG. 4, with C=2). In this embodiment, "Shadow Mode" 504 is always followed by transferring the content of the PRPG shadow to the selected PRPG in "Shadow to PRPG Mode" 502.

"Autonomous Mode" 503 can be used when no other seed is needed in the current pattern, or when another seed is needed in C cycles and C>#shifts/seed. When no other seed is needed in the current pattern, a tester repeat can be used to complete the internal load/unload with data provided by the PRPGs. In this case, the tester need only pulse the shift clock for a number of cycles, to be followed by one or more capture cycles in "Capture Mode" 505 (which captures the values in predetermined scan cells). In contrast, when another seed is needed in C cycles and C>#shifts/seed, a tester repeat can be used for C−#shifts/seed cycles, followed by "Shadow Mode"

504. For example, in FIG. 4, C=6, the first 2 cycles are in "Autonomous Mode" 503 followed by four cycles in "Shadow Mode" 504. In this embodiment, "Tester Mode" 501 always follows "Capture Mode" 505.

Multiple-input shift registers (MISRs), although theoretically providing very high unload compression, can be rendered useless by even a single X value. Aggressive DFT (design-for-test) can be employed to remove all Xs from the design, but its cost may be unacceptable and dynamic Xs may still appear. In one known technique, all Xs can be blocked off before the MISR at the cost of large input data increase to control the blocking and reduced observability due to too coarse blocking. In another known technique, Xs can be periodically cleaned from the MISR by XORing each unknown value with itself. This technique requires a large volume of input data for high X densities. In yet another known technique, the life of Xs in the MISR can be limited by removing MISR feedback and instead continuously observing a stream of output data, thereby reducing compression in exchange for some X-tolerance (which can then be enhanced by blocking Xs with more input data). In yet another technique, combinational compression instead of a MISR requires observing a stream of output data, but trades off compression for X-tolerance.

Figure 6:
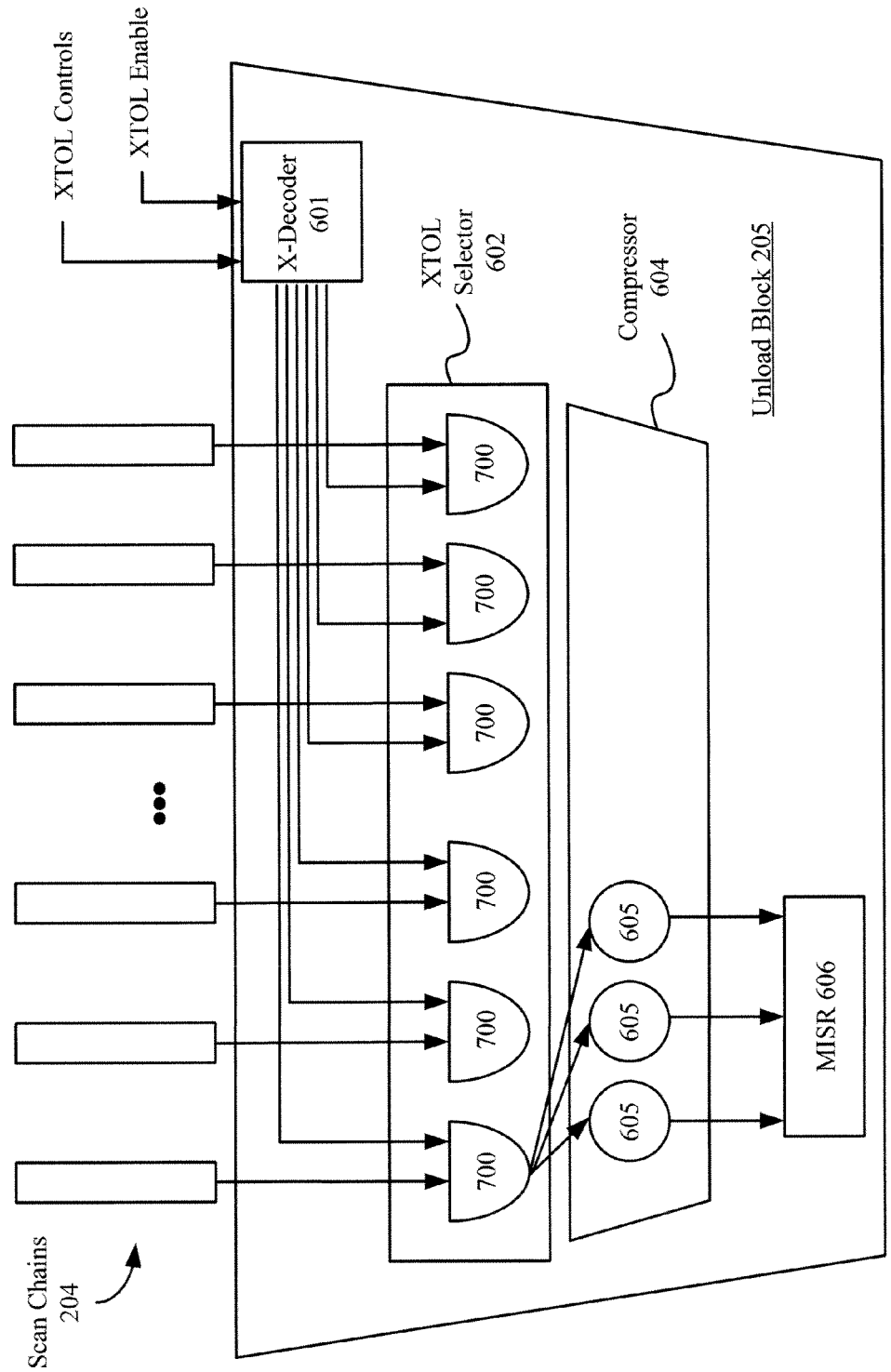
FIG. 6 illustrates an exemplary unload block that can efficiently block Xs using the fewest XTOL-control bits while maximizing observability.

In one embodiment, the precise control of per-shift X-tolerance (described above) can be combined with the very high compression realized with a MISR. FIG. 6 illustrates an exemplary unload block 205 that can efficiently block Xs using the fewest XTOL-control bits while maximizing observability. In one embodiment, unload block 205 can include an X-decoder 601, an XTOL selector 602, a compressor 604, and a MISR 606. XTOL selector 602 can receive inputs from scan chains 204 and provide its outputs to compressor 604. XTOL selector 602 can be controlled by X-decoder 601. X-decoder 601 can receive the XTOL control signals (which can change every shift) and the XTOL enable signal (which can change every re-seed).

In one embodiment, compressor 604 can be designed to guarantee no aliasing for 1, 2, 3, or any odd number of errors (Xs), which is possible because its outputs are connected to MISR 606 and therefore not constrained to a small number of ports. Compressor 604 can also be designed to eliminate 2-error MISR cancellation. In one embodiment of XTOL selector 602, an output of each decoder 700 can be provided to three phase-shifting elements (e.g. XOR gates) of compressor 604 (i.e. a fanout of 3 is used). Determining which set of phase-shifting elements receive each fanout is known by those skilled in the art of test and therefore is not described herein.

In one embodiment, MISR 606 can be unloaded after every test pattern in "Tester Mode" 501 (FIG. 5) and reset to 0 when unloaded. If separate scan input and output pins are available, the MISR unload can be overlapped with the seed load to minimize tester cycles. The failing error signature can be analyzed to provide diagnosis of failing patterns. Alternately, the user can choose to unload MISR 606 only at the end of the pattern set, thereby providing high data compression, but no direct diagnosis support.

XTOL selector 602 can be configured to support the following modes: full observability mode, no observability mode, single chain mode, and multiple observability mode. The full observability mode can be used for X-free shifts and is preferred when possible. The XTOL enable signal in its off state enables full observability between reseeds (when the XTOL enable signal can be changed). Note that full observability when the XTOL enable signal in its on state can still be selected with a minimum number of XTOL control bits. X-chains (i.e. scan chains including one or more Xs), if configured, are not observed in this mode (X-chains being described in detail in U.S. patent application Ser. No. 12/242,573, entitled "Increasing Scan Compression by Using X-chains", filed Sep. 30, 2008). The no observability mode can be used for shifts where every MISR input must be blocked. Some X-heavy designs will use this mode relatively often, so it must be selectable with few XTOL control bits.

The single chain mode can be used to observe a single internal chain for the shift where the targeted cell is observed. This mode is the only mode that allows X-chain observation and can advantageously provide full X-tolerance, i.e. any cell can be observed no matter how many other cells are X. Due to the large number of internal chains in a typical design, selecting a single chain generally requires many XTOL bits. Therefore, this mode should be used sparingly.

The multiple observability mode can be customized to each design. In this mode, various subsets of the scan chains can be observed. Thus, the multiple observability mode covers the middle ground between single and full observability modes. The selection of this mode can be coded such that the fewest possible bits are needed to select a designated subset of scan chains.

In one embodiment, a mode for XTOL selector 602 can be selected only if no Xs are passed through to compressor 604. Any mode selection can be repeated for adjacent shift cycles using a single XTOL bit per shift. Multiple observability modes can be configured so that no two scan chains are together in every group, thus an X on one of the scan chains does not preclude selection of every multiple observability mode for observing the other scan chain.

To create multiple observability modes, two or more partitions are defined on the set of non X-chains. Each partition contains the entire set. Mutually exclusive groups are defined within each partition so that each chain belongs to exactly one group of each partition. Further, each chain is in a unique set of groups, one group per partition, so the product of the number of groups per partition must be at least as large as the number of chains. Any group or its complement with respect to its partition can be selected in the multiple observability mode.

Simple chain partitioning in accordance with the multiple observability mode can be explained using 10 chains and 2 partitions. For example, partition 1 can include 2 groups of 5 chains each, whereas partition 2 can include 5 groups of 2 chains each. The total number of groups is 7 (i.e. 2+5). Exemplary groups can include group 0 (0, 1, 2, 3, 4), group 1 (5,6,7,8,9), group 2 (0,5), group 3 (1,6), group 4 (2,7), group 5 (3,8), group 6 (4,9). In one embodiment, to ensure that no two chains are in the same 2 groups, 10 (2×5) observations are allowed (e.g. observe group 0, observe group 1, observe group 2, observe group ~2 (i.e. 1,2,3,4,6,7,8,9), etc.).

In another more realistic design example, consider 1024 chains and 4 partitions. In this example, partition 1 can include 2 groups with 512 chains in each group, partition 2 can include 4 groups with 256 chains in each group, partition 3 can include 8 groups with 128 chains in each group, and partition 4 can include 16 groups with 64 chains in each group. The total number of groups is 30 (i.e. 2+4+8+16). No two chains are in the same 4 groups, so 1024 combinations are allowed (i.e. 2×4×8×16).

Providing the capability to select any one chain requires special attention to layout. A naive implementation in which the X-decoder fully decodes its inputs to provide individual chain blocking can result in wire congestion. Notably, decoding block 700, which is shown in greater detail in FIG. 7, can provide a wire-efficient configuration.

In one embodiment, block 700 can include an AND gate 701 that receives a scan chain output and an output from a multiplexer 702. Multiplexer 702 can receive the outputs from two logic gates (called shared logic 703), i.e. OR gate 704 and AND gate 705. Note that AND gate 701 is shown separate from multiplexer 702 and shared logic 703 for illustration purposes only. Each scan chain 711 has only one corresponding decoding block 700. Note that neighboring scan chains may be able to share some logic in the second level of decoding, i.e. shared logic 703. This sharing is known to those skilled in the art of decoding and therefore is not described herein. Thus, decoding block 700 represents a logical implementation, but may have a different physical implementation.

Logic gates 704 and 705 receive the same inputs, i.e. designating a set of groups. However, depending on the scan chain 711, the set of inputs (i.e. chosen from the 31 possible) can vary between decoding blocks 700. Note that X-decoder 601 can provide one output per group, plus a "single chain" control (which is common to all multiplexers 702) that indicates when the single chain mode is active. For example, in a 1024 chain (see more complex partitioning described above), X-decoder 601 can provide 31 outputs (versus 1024 in a naive implementation) 710 and receive as inputs thirteen XTOL control signals and one XTOL enable signal, with each shared logic 703 receiving a set of four inputs. Generating the 31 decoder outputs from the 14 decoder inputs is known to those skilled in the art of decode and therefore is not discussed herein. Providing one decoding block 700 per scan chain allows individual chain selection with a unique "address", which is simply the set of all groups the chain belongs to. For example, referring back to the simple partitioning described above, the set (group 0, group 2) uniquely selects chain 0, whereas the set (group 0, group 3) uniquely selects chain 1. Note that the single chain control, which is also generated from the X-decoder 601, serves as the only control to all multiplexers 702.

A simple example is provided for further illustration. If the single chain control signal is on, then any scan chain can be observed in the single chain mode. If the single chain control signal is off, then the scan chains can be observed in the other modes (i.e. the full observability, the no observability, and the multiple observability). The shared inputs to OR gate 704 and AND gate 705 are the four groups to which that scan chain belongs (see above partitioning) (i.e. each scan chain would be a member in exactly four groups, one in each partition).

Figure 7:
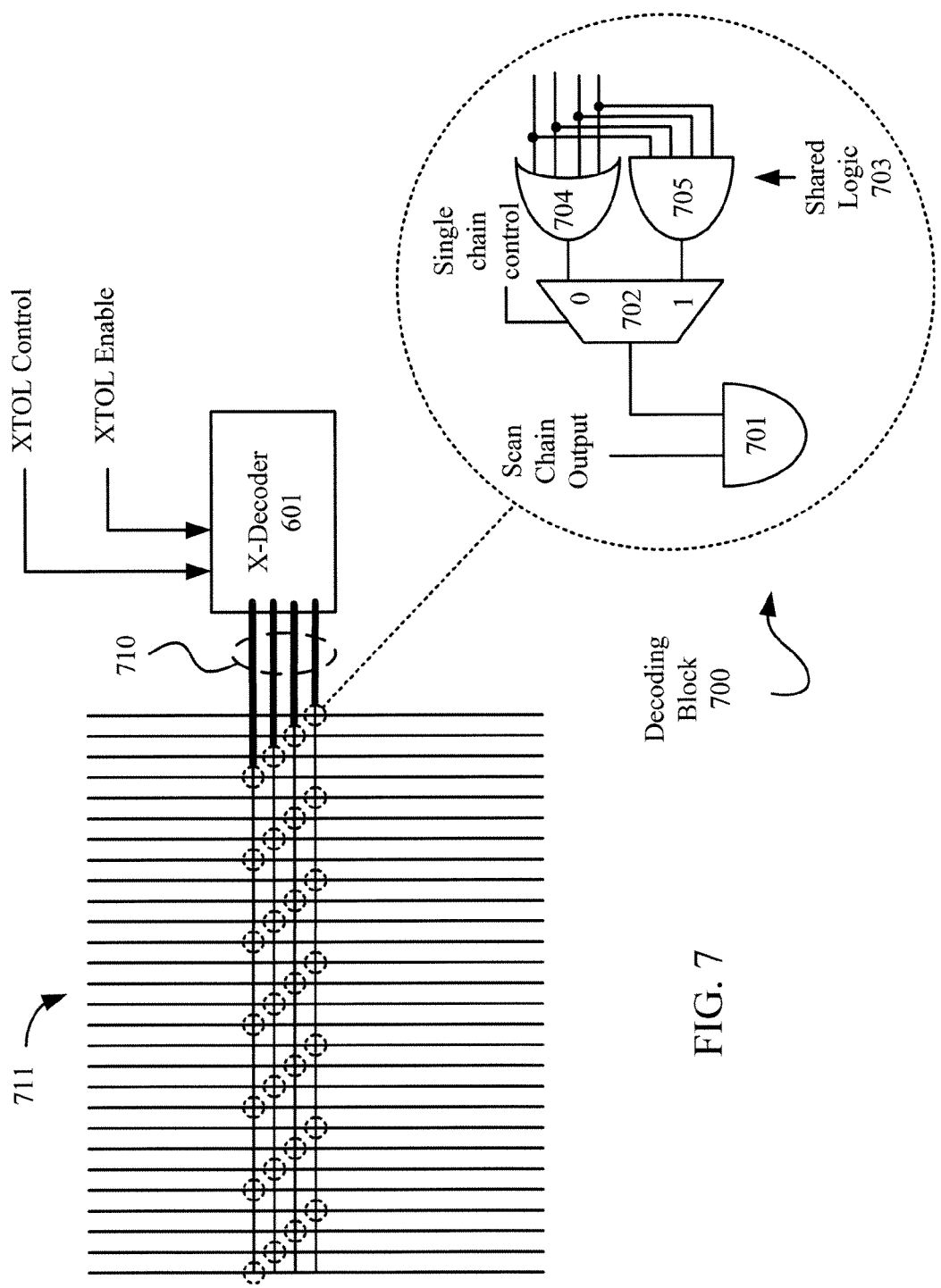
FIG. 7 illustrates an exemplary 2-level decoding block used in the X-decoder.

In full observability mode, XTOL enable is 0 (off), the single chain control signal is 0 (i.e. not in single chain control), and the other 30 outputs of X-decoder 601 will be 1. As shown in FIG. 7, if the single chain control signal is 0, all multiplexers 702 will select the outputs of OR gates 704. Because all the inputs to OR gates 704 is 1, then multiplexers 702 output only 1s. The is applied to AND gates 701 allow observability of all scan chains.

On the other hand, if XTOL enable is 1, then the XTOL control signals are used to determine the observability mode. For example, in a no observability mode, then the single chain control signal is 0 and other 30 outputs of X-decoder 601 are also 0. Multiplexers 702 once again select the outputs of OR gates 704, which in this case, output 0s. The 0s applied to AND gates 701 block all scan chain values.

In a single chain mode, the single chain control signal is 1. Thus, multiplexers 702 select the outputs of AND gates 705. Of the 30 other outputs of X-decoder 601, four of them will be 1 and the other 26 will be 0. Notably, there will be only one scan chain that receives the four 1s, i.e. the scan chain selected for observation.

In a multiple observability mode, the single chain control signal is 0. Thus, multiplexers 702 select the outputs of OR gates 704. Of the 30 other outputs to X-decoder 601, some will be 0s and others will be 1s. If at least one of the four inputs to an OR gate 704 is 1, then the corresponding scan chain is observed.

Figure 8:
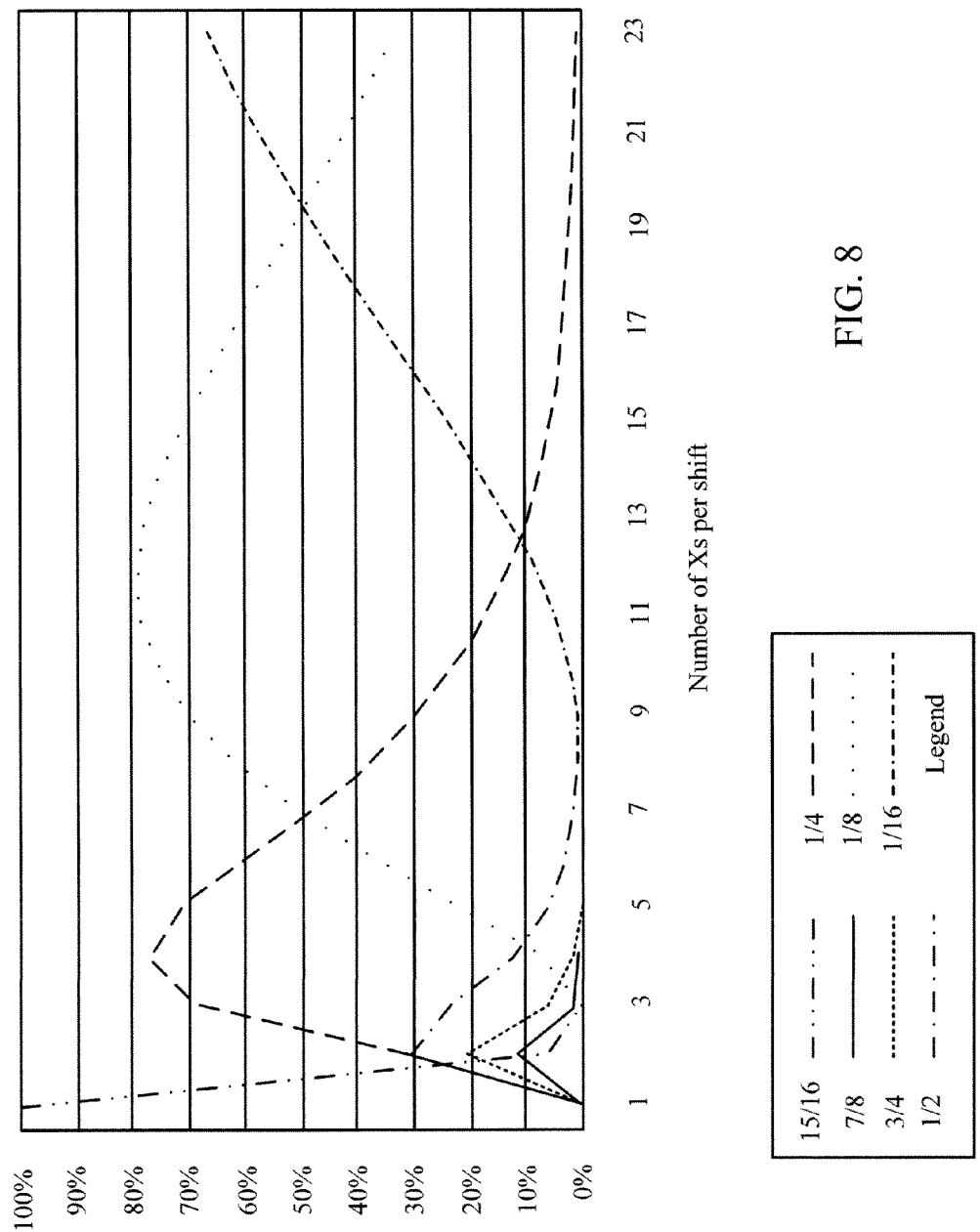
FIG. 8 illustrates a graph that demonstrates the use of the various groupings in multiple observability modes.
Figure 9:
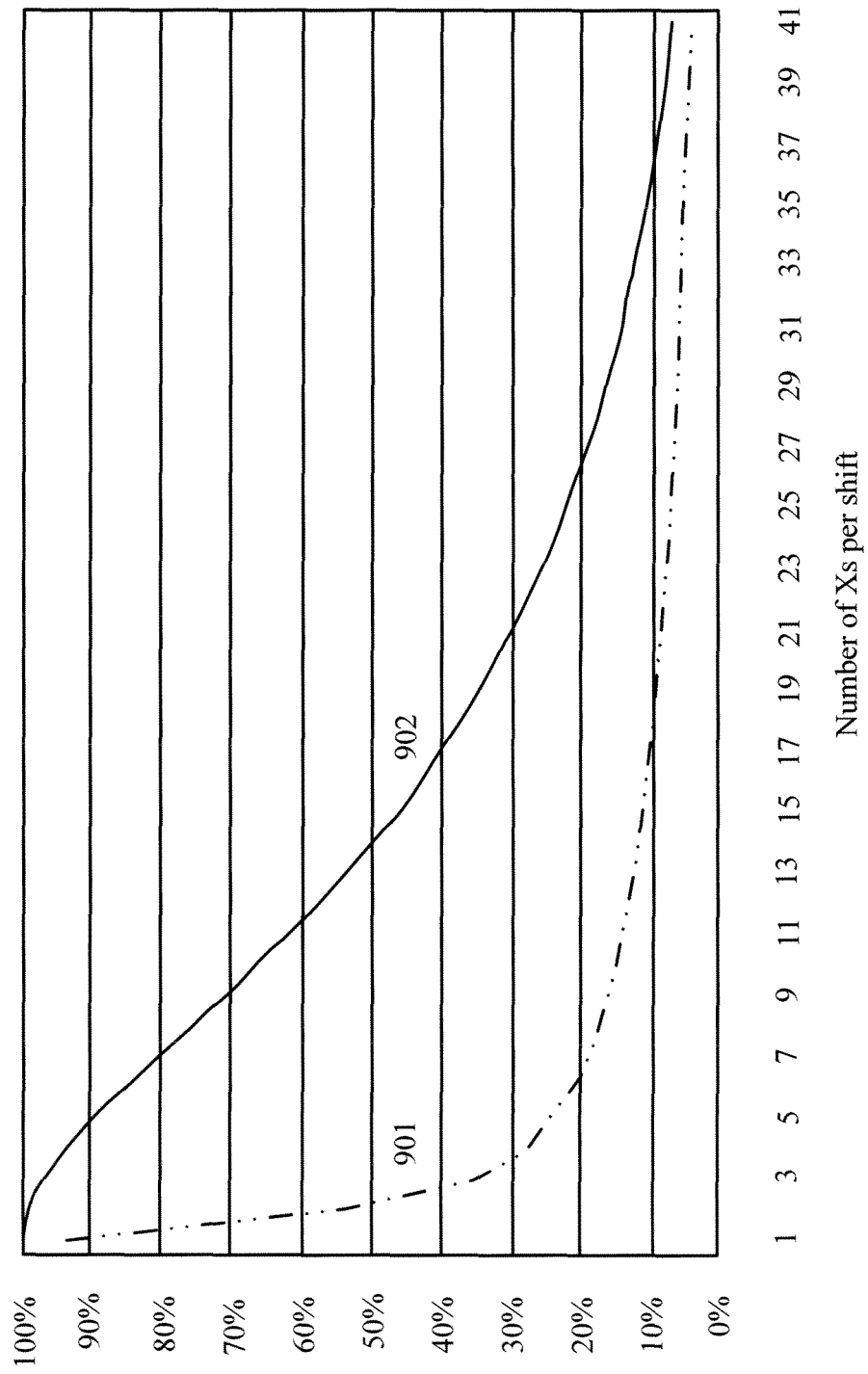
FIG. 9 illustrates a graph that shows two measures of XTOL selector quality.

The quality of the grouping in multiple observability modes can be estimated analytically by computing the probabilities of chain observation as a function of the number of Xs per shift. Results for 1024 chains are shown in FIGS. 8 and 9. The highest observability, i.e. the X-free mode was chosen in each case, so full observability was selected for no Xs, one of the 15/16 modes for 1 or few Xs, then one of the 7/8 modes, followed by 3/4, 1/2, 1/4, 1/8 and 1/16.

As shown in FIG. 8, 15/16 is exclusively used for 1 X, rarely for 2 Xs and almost never for more Xs. The sum of all curves in FIG. 8 is 100% for any number of Xs. For example, 1/4 is the most likely mode for 2 to 7 Xs per shift, then 1/8 mode is most likely for 7 to 19 Xs per shift, then 1/16 for more Xs. Single observability modes are not included in FIG. 8. Note that the complement modes, 15/16, 7/8 and 3/4 are usable only in a very narrow region around 2 Xs per shift, but this is a very frequent situation in real designs, thus complement modes are most frequently used.

FIG. 9 shows two measures of XTOL selector quality. A first curve 901 shows the average number of chains observed, which decreases quickly with increasing number of Xs. Remarkably, 20% of the chains can still be observed at 6 Xs per shift and 10% of the chains can still be observed up to 19 Xs per shift. Note that this observability is much higher than possible with previous solutions. For example, the average of observed chains is generally only about 3% for a combinational compressor or selector.

A second curve 902 in FIG. 9 indicates observable chains, i.e. the percentage of chains that can be observed, not necessarily at once, in a multiple observe mode, given that some other chains are at X. Observable chains are important because Xs tend to concentrate in certain design cells which are X for most patterns. It is crucial for ATPG to efficiently observe other chains for fault detection, not necessarily all in the same pattern, and not having to resort to single chain observability, which has a high XTOL bits cost. As indicated by second curve 902, high observability can be maintained despite high numbers of Xs per shift. For example, 50% observability can still be maintained despite 15 Xs per shift.

Figure 10:
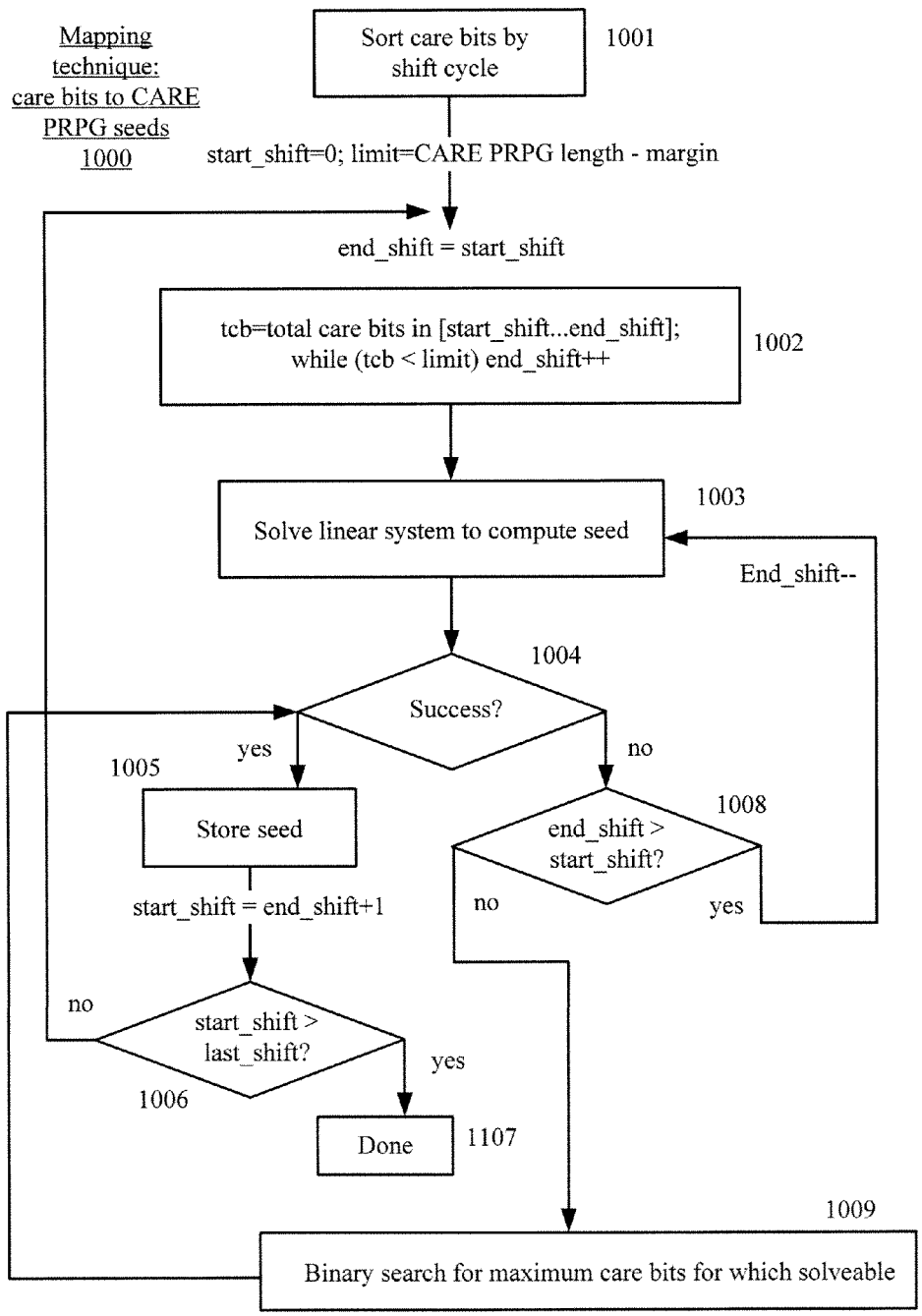
FIG. 10 illustrates an exemplary mapping technique that maps care bits to CARE PRPG seeds.

The ATPG process as modified to optimize and map test patterns to CARE and XTOL seeds is now described. FIG. 10 illustrates an exemplary mapping technique 1000 that maps care bits to CARE PRPG seeds. In technique 1000, for each pattern, the test generator stores desired care bits, flagged if needed for the primary or secondary faults. A count is kept of the number of care bits per shift. Merging of secondary faults is limited by the maximum number of bits that can be satisfied in a single shift, which is equal to the length of the CARE PRPG less a small margin. The list of care bits is used in technique 1000, which computes and stores the required CARE seeds, pattern by pattern.

In mapping technique 1000, care bits are sorted by shift cycle (1001), the variable start_shift is initialized to 0 and the variable limit to the PRPG length less a margin for which mapping to a seed is likely. A maximal window of shifts, start_shift to end_shift is computed, so that the total number of care bits in the window does not exceed the pre-computed limit (1002). If all care bits in the window can be mapped to a single seed (i.e. the linear system has a solution) (1003 and 1004), the seed is stored (1005) and will be loaded into the CARE PRPG at cycle start_shift and generate all care bits through cycle end_shift+1. Unless the last shift has just been included (1006), a new window of shifts can then be similarly processed (1002). If the last shift has just been included, then the process is done (1007).

If not all care bits in the window can be mapped to a single seed (1004), the window is linearly decreased (end_shift−−) assuming that end_shift is still greater than start_shift (1008) and an attempt is made to map the resulting care bits to a seed (1003). In rare cases, the care bits of even a single shift cannot be mapped to a seed at which point end_shift>start_shift is not true. In this case, a binary search is then performed (1009) to determine the maximum number of care bits that can be mapped to a seed. At every step during the search, a solution for the linear system of care bits is sought. Care bits flagged for the primary fault, if any, are given priority over secondary fault care bits, because the primary fault is not re-targeted by the test generator.

PRPG values computed from the seeds are loaded into the scan chains and fault simulation is performed. Secondary faults not detected because of dropped care bits are then re-targeted in future patterns.

Figure 11:
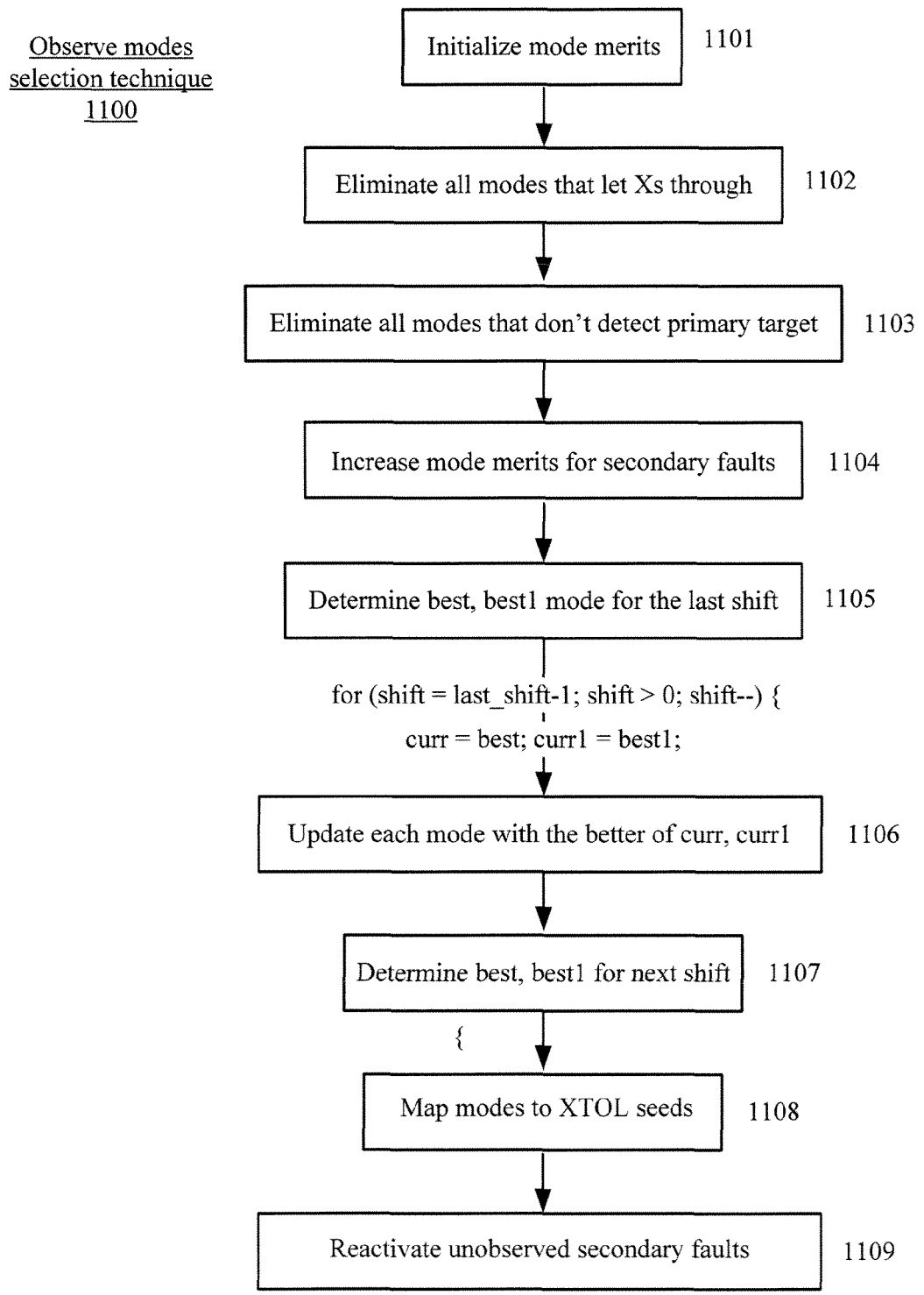
FIG. 11 illustrates an observation modes selection technique.

After M (e.g. 32) patterns have been generated and each one has been mapped to CARE seeds, simulation can be performed to determine, based on the values loaded from the CARE PRPG which scan cells capture targeted faults and which cells capture Xs. This information can then used to compute XTOL seeds for each pattern. FIG. 11 illustrates an observation modes selection technique 1100. Notably, for every pattern and every shift a mode must be selected so that: no Xs are allowed through, the primary target fault, if any, is observed, as many secondary targets as possible are also observed, as many non-targeted cells as possible are observed, and as few XTOL bits as possible are required.

For every pattern, each mode (i.e. full observability, no observability, single, multiple, and their complements) is initially assigned a merit value proportional to its observability and inversely proportional to how many XTOL-controls it would need to select (1101). In one embodiment, a small random component is also added so that different modes will be preferred for different patterns with similar X-distribution, thus encouraging fortuitous observation of all observable chains. Note that, at this point, merit values of a mode are the same for all shifts.

Next, for each shift, modes that select one or more cells at X are eliminated from consideration for that shift (1102). For the shift that observes the primary target fault, all modes that do not observe the primary target observation cell are eliminated (1103). Note that the ability to observe any single chain ensures that at least the primary target is always observable. Next, the merit value of remaining modes is boosted proportionally with the number of secondary target cells observed (1104). The two modes with highest merit values for the last shift are then stored as best and best2 (1105).

For every shift, from next-to-last down to first, each mode has its merit value updated to the better of being followed by either of the two best modes of shift+1 (stored as curr and curr2) (1106). Holding a mode has the lowest XTOL-controls cost, i.e. a single bit. The two modes with highest merit values for the current shift are then stored as best and best2 and used for the next shift (1106). In one embodiment, for fast performance, only the two best modes are computed and used. Finally, the selected best modes are mapped to XTOL seeds (1108), and then secondary faults that could not be observed are re-activated (1209) so they can be targeted by a future test pattern.

Figure 12:
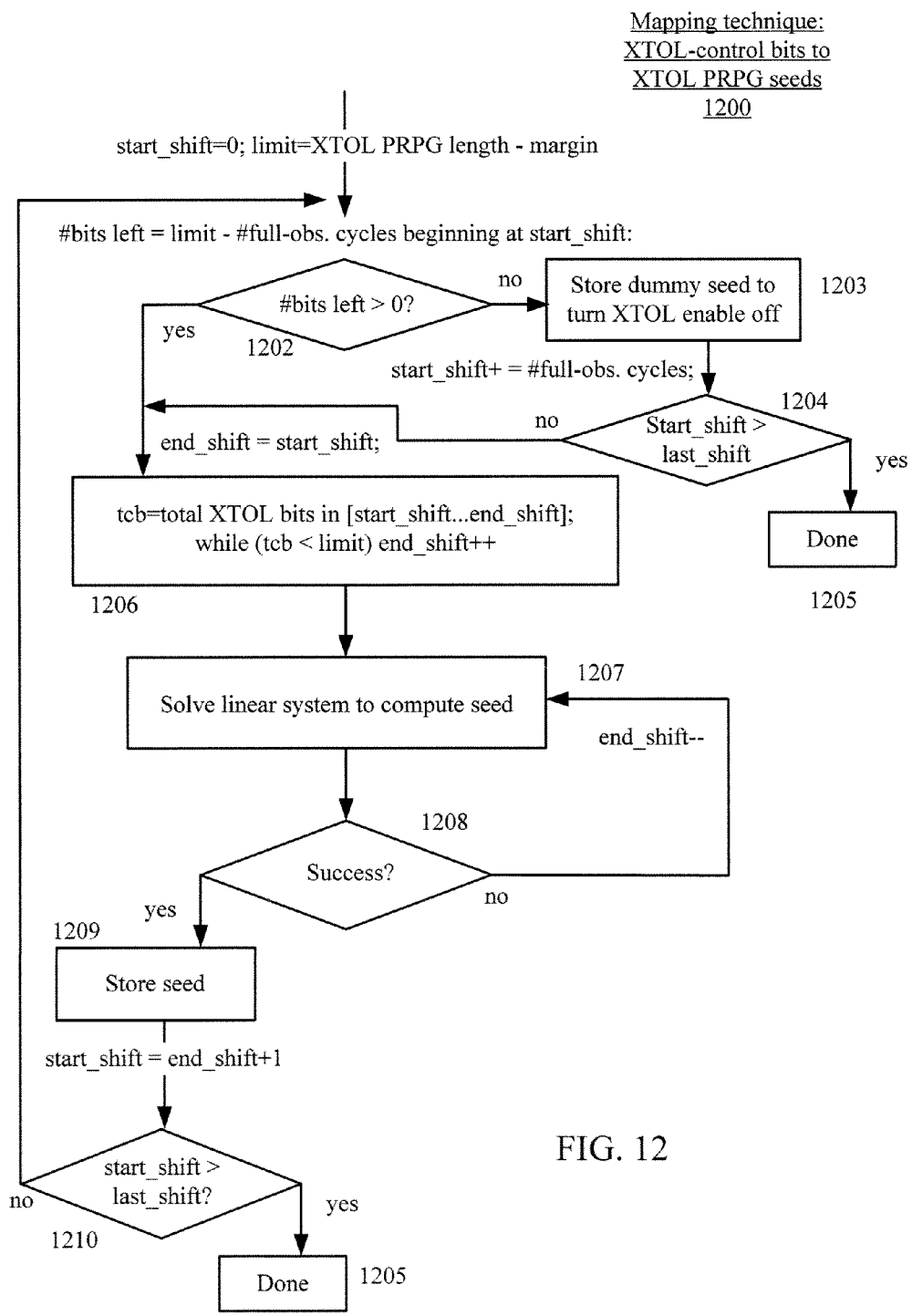
FIG. 12 illustrates an exemplary mapping technique that maps XTOL-control bits to XTOL PRPG seeds.

FIG. 12 illustrates an exemplary mapping technique 1200 (for e.g. step 1208, FIG. 12) that maps XTOL-control bits to XTOL PRPG seeds (i.e. implementing step 1108, FIG. 11). To begin mapping technique 1200, the variable start_shift is initialized to 0 and the variable limit to the PRPG length less a margin for which mapping to a seed is likely is determined.

Computing the initial shift of a window first considers if enough bits can be supplied by a new XTOL seed to hold the XTOL shadow for all full observability cycles ahead (one bit per shift is needed to hold) (1202). If not enough bits are left, it is advantageous to immediately turn XTOL_enable off (e.g. using a dummy seed) (1203). Unless the last shift has just been included (1204), a new window of shifts can then be processed (1206).

A maximal window of shifts, start_shift to end_shift is computed, so that the total number of XTOL-control bits in the window does not exceed the pre-computed limit. A linear system is solved to compute a seed (1207). If all care bits in the window can be mapped to a single seed (i.e. the linear system has a solution) (1208), the seed is stored (1209) and will be loaded into the XTOL PRPG at cycle start_shift and generate all care bits through cycle end_shift+1. Unless the last shift has just been included (1210), a new window of shifts can then be similarly processed (1202). If the last shift has just been included, then the process is done (1205).

If not all XTOL-control bits in the window can be mapped to a single seed (1208), the window is linearly decreased (end_shift−−) and an attempt is made to map the resulting care bits to a seed (1207). Note that because the number of XTOL-control bits is much smaller than the XTOL PRPG length, no needed bits are ever dropped because mapping a single shift is practically always possible.

Table 1 (below) shows an example of a test pattern for a design with internal chain length=100 and an efficient use of XTOL controls. In the first 20 shift cycles (shift cycles 0 . . . 19) there are no Xs, so XTOL enable is set off with the load of the initial CARE PRPG seed and selects full observability mode (FO). There is 100% observability in these cycles (assuming no X-chains). Cycle 20 has 1 X. Therefore, cycle 20 is preceded by an XTOL PRPG load and setting XTOL enable on (the seed was loaded overlapped with the internal shift in the previous cycles). A 15/16 mode is selected using 8 bits derived from the XTOL PRPG. Cycles 21 to 29 are again X-free; however, XTOL enable is now on, so in cycle 21 the full observability mode is selected using 3 bits of the XTOL PRPG. Thereafter, in cycles 22 to 29 only 1 bit per shift is used to hold the value of the XTOL shadow. Cycle 30 has 5 Xs. In this case, 8 bits are used from the XTOL PRPG to select a 1/4 mode, which is chosen to match the needs of the next cycles as well. Specifically, cycles 31 to 39 have between 3 and 7 Xs per shift and the same 1/4 mode is used. Note that only 1 bit per shift is used to hold the value of the XTOL shadow. The last 60 cycles have no Xs. Therefore, another seed is loaded and XTOL enable is set off for full observability. Notably, in this example, only 36 XTOL bits were used to block a total of 50 Xs in 11 cycles and achieve an average observability of 92%.

TABLE 1

XTOL Example

| Shift Cycle # | #Xs/shift | XTOL_enable | XTOL_ctrl | Selection | XTOL bits | Observ. | Event |
|---|---|---|---|---|---|---|---|
| 0 ... 19 | 0 | 0 | ? | FO | 0 | 100% | Load CAREPRPG |
| 20 | 1 | 1 | 1 | 15/16 | 8 | 94% | Load XTOLPRPG |
| 21 | 0 | 1 | 1 | FO | 3 | 100% | |
| 22 ... 29 | 0 | 1 | 0 | FO | 1 per shift | 100% | XTOL_Shadow holds |
| 30 | 5 | 1 | 1 | 1/4 | 8 | 25% | |
| 31 ... 39 | 3 ... 7 | 1 | 0 | 1/4 | 1 per shift | 25% | XTOL_Shadow holds |
| 40 ... 99 | 0 | 0 | ? | FO | 0 | 100% | Load CAREPRPG |

Figure 13:
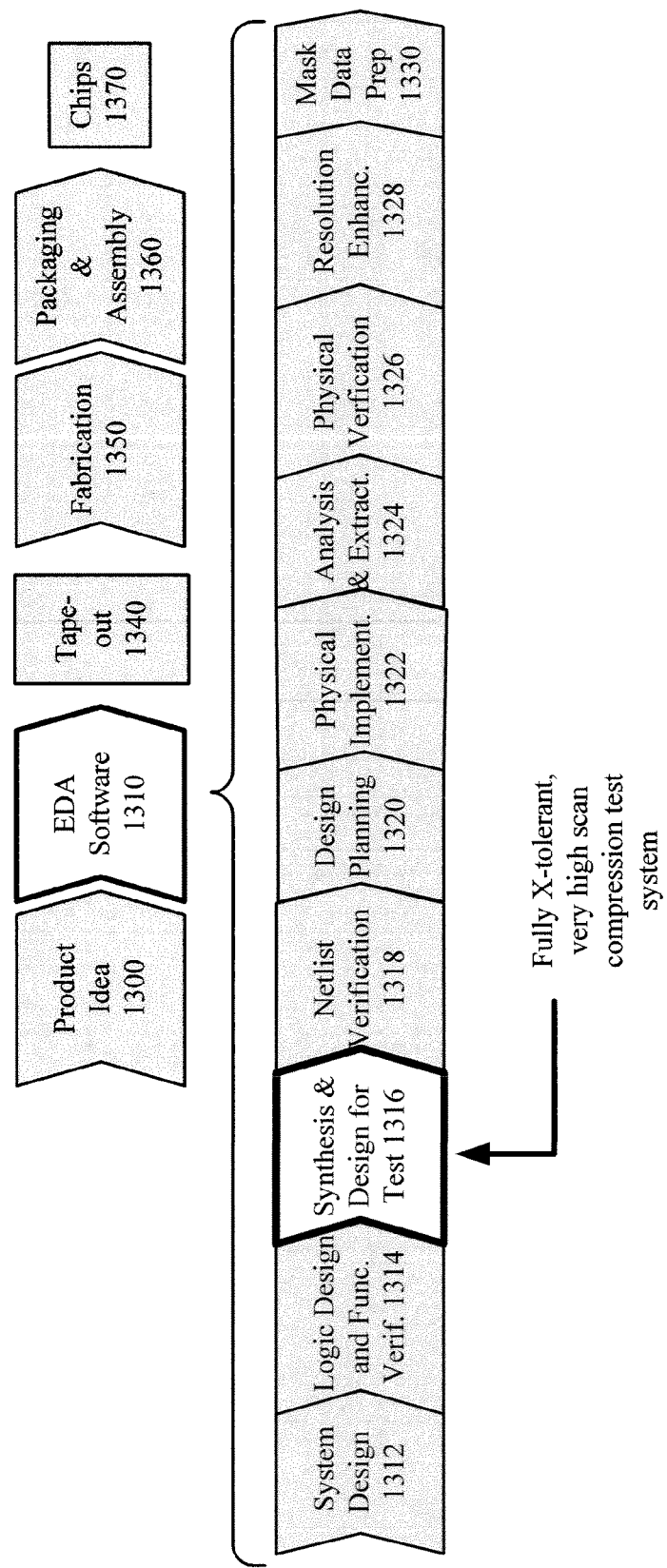
FIG. 13 shows a simplified representation of an exemplary digital ASIC design flow including the described adaptive scan compression techniques.

FIG. 13 shows a simplified representation of an exemplary digital ASIC design flow including the above-described fully X-tolerant, very high scan compression. At a high level, the process starts with the product idea (step 1300) and is realized in an EDA software design process (step 1310). When the design is finalized, it can be taped-out (event 1340). After tape out, the fabrication process (step 1350) and packaging and assembly processes (step 1360) occur resulting, ultimately, in finished chips (result 1370).

The EDA software design process (step 1310) is actually composed of a number of steps 1312-1330, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 1310) will now be provided:

System design (step 1312): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 1314): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include VCS, VERA, DesignWare®, Magellan, Formality, ESP and LEDA products.

Synthesis and design for test (step 1316): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler, Tetramax, DesignWare®, and DFT MAX products. In one embodiment, the above-described fully X-tolerant, very high scan compression techniques can be used during step 1416.

Netlist verification (step 1318): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 1320): Here, an overall floorplan for the chip is constructed and analyzed for timing and top-level routing. Exemplary EDA software products from Synopsys, Inc. that can be used at this step include Astro and IC Compiler products.

Physical implementation (step 1322): The placement (positioning of circuit elements) and routing (connection of the same) occurs at this step. Exemplary EDA software products from Synopsys, Inc. that can be used at this step include the Astro and IC Compiler products.

Analysis and extraction (step 1324): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 1326): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 1328): This step involves geometric manipulations of the layout to improve manufacturability of the design. Exemplary EDA software products from Synopsys, Inc. that can be used at this step include Proteus, ProteusAF, and PSMGen products.

Mask data preparation (step 1330): This step provides the "tape-out" data for production of masks for lithographic use to produce finished chips. Exemplary EDA software products from Synopsys, Inc. that can be used at this step include the CATS(R) family of products.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

For example, the above-described on-chip compression elements can be individually optimized for each design, e.g. based on the number of scan inputs, outputs, internal chains and, optionally, X-chains. Logically, smaller designs can use smaller PRPGs and MISRs (e.g. 32 bits), whereas large designs should use larger PRPGs and MISRs (e.g. 64 or even 100+ bits) or even multiple compressor/decompressor structures to ease routing. The PRPG and MISR lengths can be fine-tuned to balance the number of tester cycles to load and unload data. For example, a design with 6 scan inputs, 12 scan outputs, and 1024 chains could be configured with 65-bit PRPGs, so that the PRPG shadow length is 66 and is divisible by 6, to utilize every bit of the 11 cycles to load. The corresponding MISR could be 60 bits long to be divisible by 12 (number of outputs).

Note that irrespective of configuration, the operations during test application are described in the state diagram shown in FIG. 5. Note further that loading seeds and unloading the MISR may run at different clock frequency than the internal shift. In this case, the hardware for the test system need not change; only the thresholds of how many cycles "Shadow Mode" is used need adjusting. The number of scan inputs and outputs can be as low as 1; even a single bi-directional bit can be used in "Tester Mode" to first unload the MISR and then load a seed. Notably, data volume is independent of the number of scan inputs and outputs.

PRPG shadow registers are described in U.S. Pat. No. 6,950,974, which issued Sep. 27, 2005, and is entitled "Efficient Compression and Application of Deterministic Patterns in a Logic BIST Architecture" as well as in U.S. Pat. No. 7,237,162, which issued Jun. 26, 2007, and is entitled "Deterministic BIST Architecture Tolerant of Uncertain Scan Chain Outputs", both of which are incorporated by reference. Other configurations for the shadow registers, e.g. varying the number of multiplexers versus storage elements, can be used in other embodiments.

Accordingly, it is intended that the scope of the invention be defined by the following Claims and their equivalents.

The invention claimed is:

1. A method of selecting observability modes for a scan test, the method comprising:

initializing mode merits associated with the observability modes;

for each shift, eliminating any observability mode that lets an unknown value (X) through;

for each shift, eliminating any observability mode that fails to detect a primary target of the scan test;

increasing the mode merits for secondary faults based on a number of secondary targets observed;

for each shift, determining a best observability mode and a second best observability mode for a shift based on total mode merits; and using a scan test system, mapping resulting observability modes to X-tolerance (XTOL) seeds.

2. The method of claim 1, wherein the observability modes include full observability, no observability, single observability, and multiple observability.

3. The method of claim 2, wherein the observability modes include complements of the observability modes.

4. The method of claim 1, further including, before the mapping resulting observability modes, storing two modes with highest values for a last shift.

5. The method of claim 4, further including, for every shift from next-to-last down to first, updating a merit value for each mode to a better of being followed by each of the two modes of shift+1.

6. The method of claim 5, further including, storing two modes with highest values for a current shift.

7. The method of claim 1, further including re-activating secondary faults that were not observed, thereby allowing targeting by a future test pattern.

\* \* \* \* \*